(12) United States Patent
Hou

(10) Patent No.: US 8,301,096 B2
(45) Date of Patent: Oct. 30, 2012

(54) AUTOMATIC GAIN CONTROL METHOD AND APPARATUS

(75) Inventor: Hsin-An Hou, Banciao (TW)

(73) Assignee: Industrial Technology Research Institute, Hsinchu (TW)

( * ) Notice: Subject to any disclaimer, the term of this patent is extended or adjusted under 35 U.S.C. 154(b) by 365 days.

(21) Appl. No.: 12/686,468

(22) Filed: Jan. 13, 2010

(65) Prior Publication Data

US 2010/0259327 A1 Oct. 14, 2010

(30) Foreign Application Priority Data

Apr. 8, 2009 (TW) ................................ 98111727 A

(51) Int. Cl.
*H04B 17/00* (2006.01)
*H04B 7/00* (2006.01)
(52) U.S. Cl. .................................. 455/232.1; 455/240.1
(58) Field of Classification Search ............... 455/127.2, 455/136, 138, 219, 232.1, 240.1, 250.1
See application file for complete search history.

(56) References Cited

U.S. PATENT DOCUMENTS

| | | | | |
|---|---|---|---|---|
| 5,627,857 A | * | 5/1997 | Wilson | 375/219 |
| 5,999,718 A | * | 12/1999 | Wang et al. | 703/2 |
| 6,363,127 B1 | | 3/2002 | Heinonen et al. | |
| 6,574,292 B2 | * | 6/2003 | Heinonen et al. | 375/345 |
| 6,843,597 B1 | | 1/2005 | Li et al. | |
| 6,983,133 B2 | * | 1/2006 | Park | 455/127.2 |
| 7,031,409 B2 | | 4/2006 | Brobston et al. | |
| 7,065,165 B2 | | 6/2006 | Heinonen et al. | |
| 7,295,073 B2 | | 11/2007 | Hsieh et al. | |
| 7,336,743 B2 | | 2/2008 | Ma et al. | |
| 2002/0090042 A1 | | 7/2002 | Heinonen et al. | |
| 2003/0194029 A1 | | 10/2003 | Heinonen et al. | |
| 2006/0135102 A1 | | 6/2006 | Lee et al. | |
| 2007/0041480 A1 | | 2/2007 | Azakami et al. | |
| 2007/0076783 A1 | | 4/2007 | Dishman et al. | |
| 2009/0060102 A1 | | 3/2009 | Wong et al. | |

FOREIGN PATENT DOCUMENTS

EP  1 653 610  5/2006

OTHER PUBLICATIONS

European Search Report dated Sep. 19, 2011.

* cited by examiner

*Primary Examiner* — Sonny Trinh
(74) *Attorney, Agent, or Firm* — Thomas|Kayden

(57) ABSTRACT

Automatic gain control method and apparatus control a gain of a received signal. While the gain is adjusted and thus converges, a finding mode is entered to additionally change the gain at least once according to at least one characteristic value obtained from a relationship between the gain and time, such that the gain approaches a target level. In other embodiments, a tracking mode is further entered to periodically adjust the gain at a period greater than that before when signal strength is being tracked to reduce noise energy introduced. Hence, the embodiments can improve a gain converging speed and reduce the influence of the noise on the communication system in a dynamic receiving environment, and thus enhance the signal receiving performance.

28 Claims, 15 Drawing Sheets

AUTOMATIC GAIN CONTROL METHOD AND APPARATUS

This application claims the benefit of Taiwan application Serial No. 98111727, filed Apr. 8, 2009, the subject matter of which is incorporated herein by reference.

TECHNICAL FIELD

The invention relates to a method of processing a received signal and a signal receiving apparatus.

BACKGROUND

Communication systems are directed to systems for demodulating and decoding according to the signal strength or its induced value, and include wired and wireless communication systems, and broadcasting and data accessing communication systems. In the typical communication systems, the signal strengths in different channels rise and fall due to the influence of the characteristics of the channels. If the strength of the received signal of the receiving end is adjusted by an automatic gain controller, the received signal may be kept within a fixed strength range to prevent the receiving end from misestimating the message of the received signal.

In the practical system, however, the signal strength adjusted by the automatic gain controller is not perfectly unchanged as in the assumption mentioned above. The operation principles of the automatic gain apparatus in the Gaussian channel and the fixed multi-path channel environment will be described by taking the Gaussian channel environment as an example. In the Gaussian channel environment, the automatic gain controller adjusts the value of the loop gain, and makes a balanced consideration between the gain converging speed and the gain jitter extent in the stable state. When the loop gain is high, the speed of converging the gain to the ideal level is fast, but the up and down jitters above and below the ideal level become severe, as shown by the up and down jitters of the gain curve 100 above and below the ideal level 10 after the time point t1 of FIG. 1. When the loop gain is low, if the switching point is not good, the speed of converging the gain to the ideal level is slow, but the up and down jitters above and below the ideal level become smooth, as shown by the dashed line 110 or 120 of the gain variation of FIG. 1.

Thus, the system designers have proposed various methods of adjusting the gains to improve the gain converging speed and the condition of the jitters of gains in the stable state. For example, a method characterized in the algorithm of the gain adjusting control signal generator is disclosed in U.S. Pat. No. 7,336,743. The method includes course and fine regulation stages, and adjusts the gain in a stepped manner in the course stage to improve the gain converging speed. The course method is to determine to increase the gain, decrease the gain or keep the gain unchanged according to the result of the signal strength comparator, wherein the increased or decreased value of the gain is a predetermined constant. In addition, U.S. Pat. No. 7,295,073 discloses a method characterized in that the gain is adjusted according to the maximum amplitude of the signal so that the signal sampled in the range of the analog-to-digital converter has the maximum utilization efficiency. The method integrates the signal strength estimating function and the signal strength comparing function into the amplitude level detector, and the detected result is outputted to the range detector. The range detector determines to increase the gain, decrease the gain or keep the gain unchanged according to the result of the amplitude level detector, wherein the increased or decreased value of the gain is a predetermined constant.

In the dynamic channel environment, however, when the stable track signal strength of the automatic gain controller changes and immediately compensates the path loss, the adjustment signal strength is continuously adjusted in the code period time, thereby deteriorating the receiving performance of the receiver by the additionally introduced jitter noise. For example, the conventional automatic gain controller, such as that disclosed in each of U.S. Pat. Nos. 7,336,743; 7,295,073; 7,031,409 and 6,574,292, periodically adjusts the gain at the system working frequency. In the dynamic environment, the additionally introduced jitter noise deteriorates the receiving performance of the receiver, so it is greatly influenced by the non-linear noise and the dynamic channel.

To sum up, the conventional automatic gain controller, which is made in order to improve the gain converging speed, cannot effectively avoid the problem that the noise is introduced when the track path loss changes. Thus, the noise greatly influences its receiving performance in the dynamic environment.

BRIEF SUMMARY

Embodiments of an automatic gain control method and an apparatus are disclosed, which can be applied to various receiving environments to enhance the signal receiving performance. In the stationary receiving or dynamic receiving environment, while the gain is adjusted to converge, the finding mode determines at least one switching value and thus additionally changes the gain to shorten the gain converging time.

Furthermore, in other embodiments, after the finding mode, the tracking mode periodically adjusts the gain to reduce the noise energy introduced when the signal strength is being tracked (e.g., in the dynamic receiving environment). Thus, the exemplary embodiment can improve the gain converging speed. In addition, in the high-speed dynamic environment, other exemplary embodiment can further reduce the influence of the noise on the system. Thus, the embodiments of the invention can enhance the performance of the receiver in different receiving environments.

An exemplary embodiment of an automatic gain control method is provided. The method includes: adjusting a gain of a received signal in a finding mode, while additionally changing the gain at least once according to a variation condition of a gain curve of the gain such that the gain approaches a target gain level. The step of additionally changing the gain comprises the sub-steps of: detecting at least one characteristic point of the gain curve; determining a switching value for making the gain approach the target gain level according to the at least one characteristic point detected; and setting the gain to a new gain according to the switching value and making the new gain become valid. The detecting, determining and setting sub-steps are performed at least once.

In another method according to other embodiments, the method further includes the step of entering a tracking mode when the step of setting the gain is performed for the last time. In the tracking mode, whether the gain is to be adjusted is determined periodically. The gain is adjusted in the tracking mode is at a period greater than a period at which the gain is adjusted in the finding mode.

An exemplary embodiment of an automatic gain control apparatus is provided. The apparatus includes a variable gain amplification unit, an analog-to-digital converter and a main control unit. The variable gain amplification unit controls a received signal according to a gain and thus generates a first signal. The analog-to-digital converter generates a digital signal according to the first signal. The main control unit generates a gain control signal according to the digital signal and a target level. The gain of the variable gain amplification unit is adjusted according to the gain control signal. When the main control unit operates in a finding mode, while the gain is being adjusted, the control unit additionally changes the gain at least once according to at least one characteristic value, obtained from a relationship between the gain and time, such that the gain approaches a target gain level.

Embodiments of the main control unit of the automatic gain control apparatus of the exemplary embodiment are provided. In one embodiment, the main control unit includes a detection unit and a control unit. The detection unit generates a gain signal according to the digital signal and a target level signal. The control unit generates a gain control signal according to the gain signal. The gain of the variable gain amplification unit is adjusted according to the gain control signal. When the control unit operates in a finding mode, while the gain is being adjusted, the control unit additionally changes the gain at least once according to at least one characteristic value obtained from a relationship between the gain and time such that the gain approaches a target gain level.

In some embodiments, the main control unit can be implemented by using a programmable processing circuit, a digital signal processor or logic circuit. In still another embodiment, the main control unit includes a power discriminator and a control unit. The power discriminator generates a comparison signal according to the digital signal and a target level signal. The control unit generates a gain control signal according to the comparison signal. The gain of the variable gain amplification unit is adjusted according to the gain control signal. When the control unit operates in a finding mode, while the gain is being adjusted, the control unit additionally changes the gain at least once according to at least one characteristic value obtained from a relationship between the gain and time such that the gain approaches a target gain level.

In apparatuses according to other embodiments, after the gain additionally set for the last time becomes valid, a tracking mode is entered or selectively entered. In the tracking mode, the main control unit periodically judges whether to adjust the gain. The gain is adjusted in the tracking mode at a period greater than a period at which the gain is adjusted in the finding mode.

It is to be understood that both the foregoing general description and the following detailed description are exemplary and explanatory only and are not restrictive of the disclosed embodiments, as claimed. The following description is made with reference to the accompanying drawings.

DETAILED DESCRIPTION

A finding mode, a tracking mode and a combination thereof will be disclosed in the automatic gain control methods according to various exemplary embodiments to improve the gain converging speeds under various receiving environments. In addition, one embodiment of the automatic gain control method is applied to the dynamic receiving environment, resulting in reduction of the influence of the noise on the system and enhancement of the path loss compensation in the dynamic receiving environment. Thus, the signal receiving performance may be increased.

Figure 1:
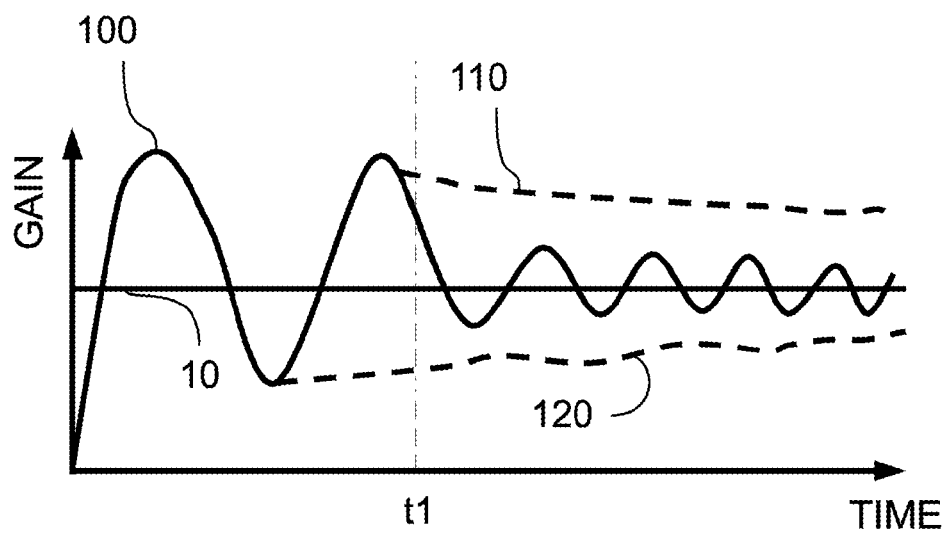
FIG. 1 (Prior Art) shows gain converging curves of different loop gains under the Gaussian channel.
Figure 3A:
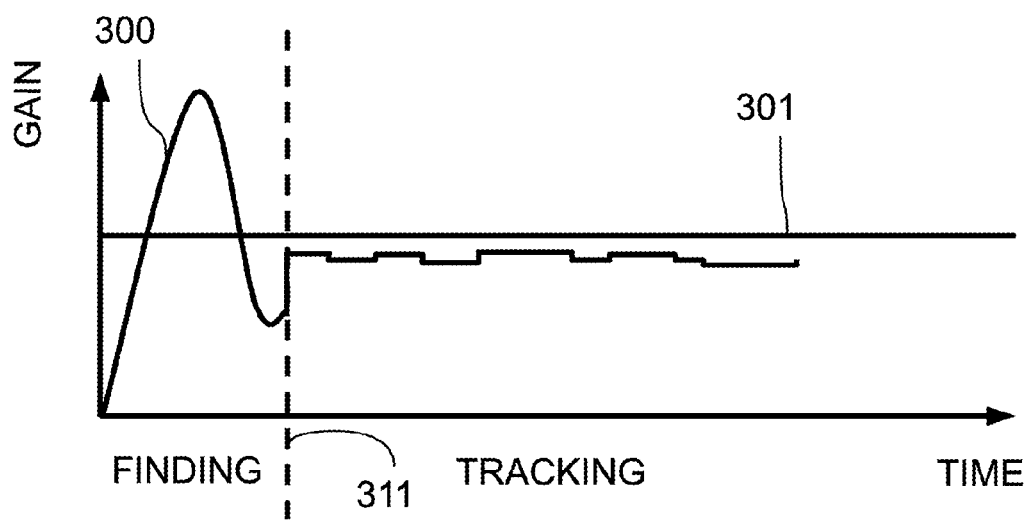
FIGS. 3A to 3C are schematic illustrations showing an automatic gain control method applied to a dynamic receiving environment according to an exemplary embodiment.
Figure 3B:
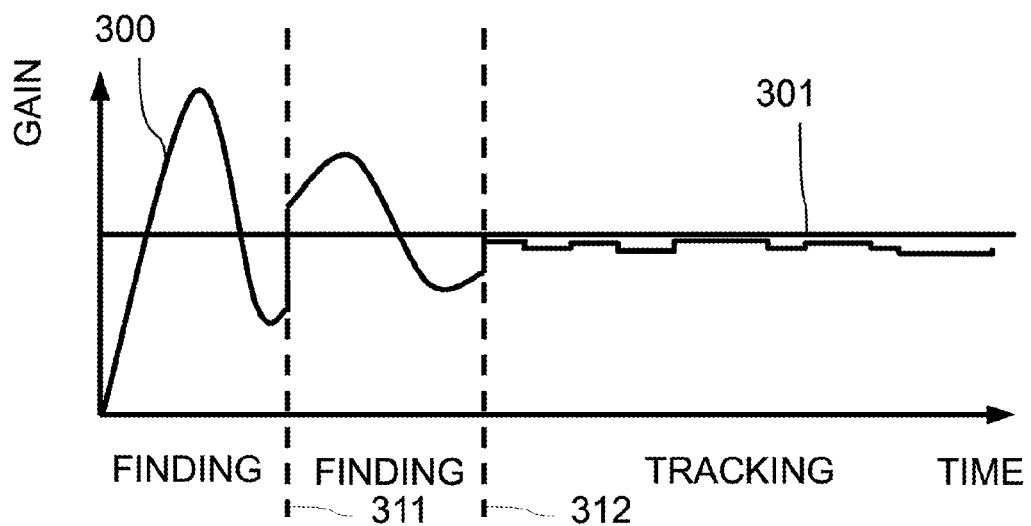

In a communication system, when a gain curve of a gain of an automatic gain controller is converging, the gain is controlled by an automatic gain control method and is thus adjusted. As shown in the gain curve 100 of FIG. 1, the gain curve oscillates up and down with the ideal level 10 serving as the middle level. In one exemplary embodiment of the method, a finding mode is entered while the gain is converging, and the gain is additionally changed at least once according to at least one characteristic value (e.g., the local maximum and the local minimum), which is obtained from the relationship between the gain and time, such that the gain approaches a target gain level. In this case, it is necessary to find at least one characteristic value from the previous gains and thus to calculate a switching value to determine the value of the additionally changed gain. According to the conception of the gain curve, a switching point of the gain curve is determined, and the gain is substantially switched to the target gain level (i.e., the target gain level or the level near the target gain level) so that the gain converging time can be quickly shortened. As shown in FIG. 3A, the gain curve 300 is switched to the value approaching and under the gain level 301 after the time point 311. Furthermore, in another example, the next switching point may be found according to the similar manner so that the next switching point becomes nearer to the ideal level. As shown in FIG. 3B, the gain curve 300 is switched to the level above the gain level 301 after the time point 311, and varies according to the originally performed automatic gain control method and then converges. After the local maximum and minimum have occurred for one time, another suitable switching point is found. At the time point 312, the gain curve switches to the value approaching the gain level 301.

Figure 3C:
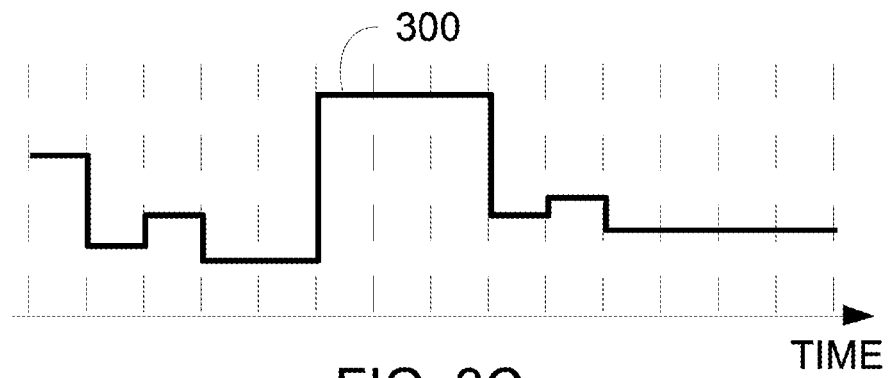

After at least one switching operation, the method according to the exemplary embodiment enters another mode, referred to as a tracking mode, and the variation of the gain curve 300 is shown by the gain curve 300 after the time point 311 of FIG. 3A or the gain curve 300 after the time point 312 of FIG. 3B. FIG. 3C is a schematic illustration showing an enlarged gain curve in the tracking mode of FIG. 3B, wherein the dashed line of the vertical axis represents the update period, and how to update the value of the gain curve 300 is periodically determined.

An example of the varying channel condition in the dynamic channel environment is taken for the sake for understanding of the function of the tracking mode. This example illustrates that the gain converging speed and the gain jitter extent in the stable state has to be considered so that the automatic gain control apparatus can enhance the path loss compensation as well as reduce the influence of the noise on the system in the dynamic channel environment.

Figure 2:
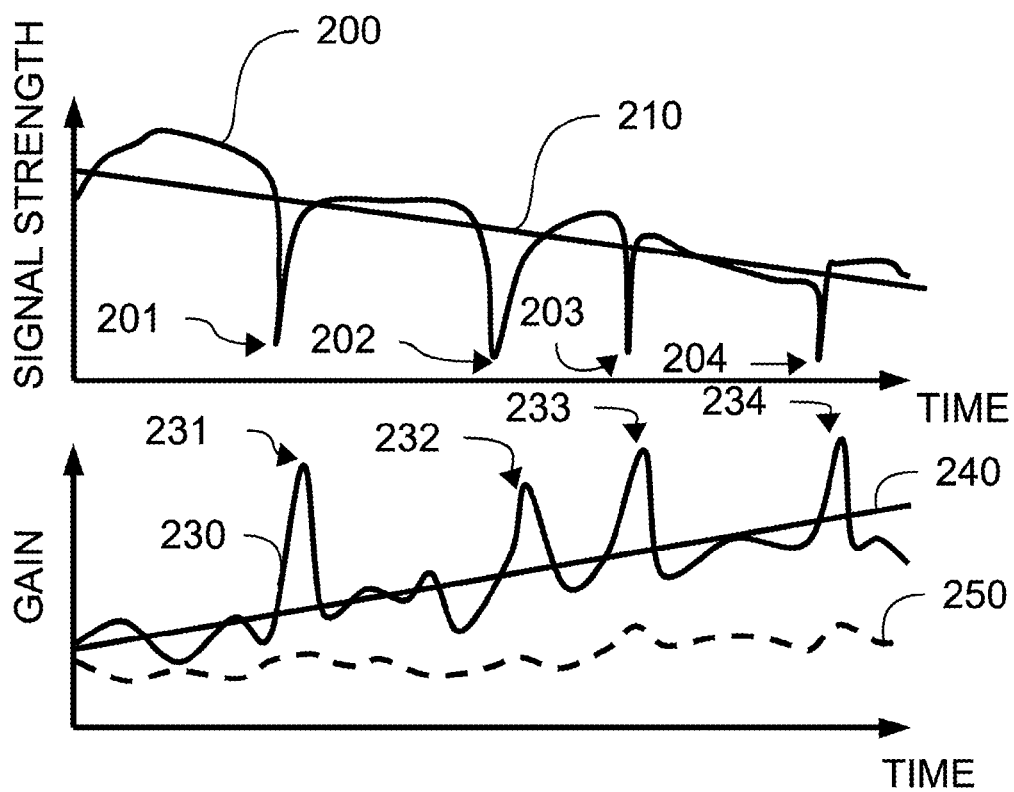
FIG. 2 shows gain converging curves of different loop gains under the mobile channel.

In the dynamic channel environment, the received signal strength encounters the dual-effect including the path loss 210 and the Doppler effect. The signal strength is influenced by the Doppler effect and is indicated by the valleys 201, 202, 203 and 204 of the signal strength curve 200 of FIG. 2. It is desired that the ideal automatic gain controller can compensate the signal strength caused by the path loss while the Doppler effect may be neglected. In FIG. 2, the sloped line 240 is an ideal gain curve reflecting the path loss. When the gain curve, such as 230, corresponding to high loop gains is with its path loss compensation in a high speed, the gain tends to be influenced by the Doppler effect, and the jitter is severer, as indicated by the peaks 231, 232, 233 and 234 of the gain curve 230 of FIG. 2. As observed by the inventor, it is found that lower loop gains correspond to the path loss compensation in a low speed, the gain cannot be easily influenced by the Doppler effect, the jitter is smoother, as indicated by the gain curve 250 in dashed line of FIG. 2.

As shown in FIGS. 3A and 3B, the original automatic gain control is performed in the finding mode according to the shorter period (i.e., the higher operation frequency) such that the gain curve continuously rises and falls. Comparatively, the update period in the tracking mode may be lengthened (i.e., the lower operation frequency is adopted) to reduce the introduction of the jitter noise. In addition, a significant gain adjustment is adopted to compensate for the degradation of the capability of tracking path loss due to the lengthened update period. Thus, the tracking mode can be adapted to the dynamic receiving environment, wherein the gain cannot be easily influenced by the Doppler effect, the jitter is smoother, the path loss compensation can be enhanced, and the influence of the noise on the signal can be reduced.

Figure 3D:
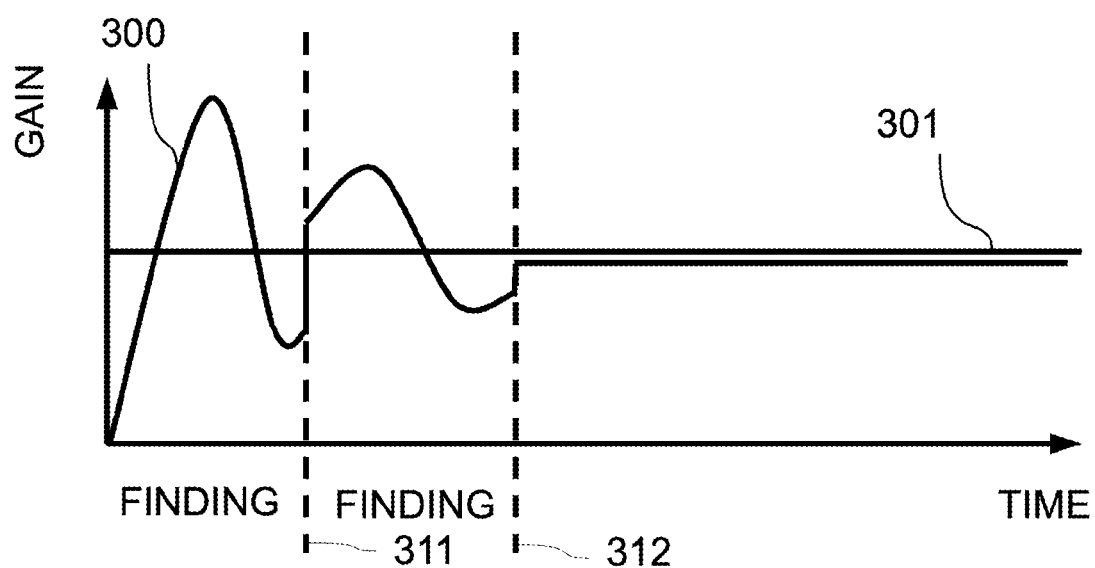
FIG. 3D is a schematic illustration showing the automatic gain control method applied to a stationary receiving environment according to an exemplary embodiment.

In addition, for the stationary receiving environment, the automatic gain control method according to an exemplary embodiment, after the finding mode ends, adjusts and converges the gain according to the originally performed manner for automatic gain control. As shown in FIG. 3D in the finding mode, the gain curve 300 encounters two times of switching, that is, setting of the gain is additionally performed twice at the time points 311 and 312. After the last time switching at the time point 312, the gain curve 300 is further close to the gain level 301, and then converges according to the originally performed automatic gain control. As shown in FIG. 3D, the gain curve 300 after the time point 312 changes to a gain close to the gain level 301.

Furthermore, the automatic gain control method according to another exemplary embodiment includes the finding mode, and determines whether to further enter the tracking mode selectively according to the receiving environment and the actual condition, e.g., whether the dynamic environment is at the high speed or the low speed.

Figure 4A:
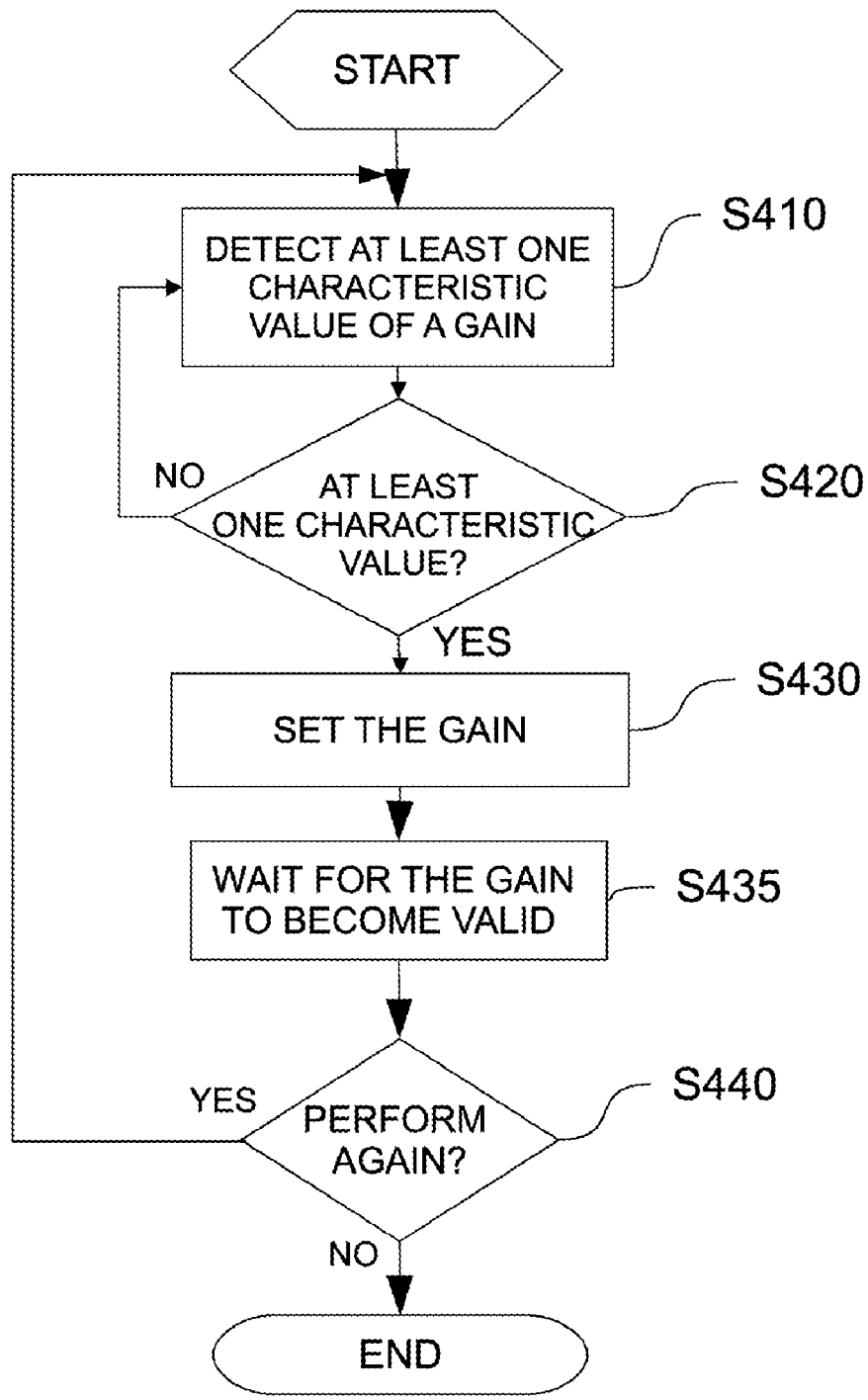
FIG. 4A is a flow chart showing the automatic gain control method applied to a stationary receiving environment according to an exemplary embodiment.

FIG. 4A is a flow chart showing the automatic gain control method according to an exemplary embodiment. In this embodiment, the steps of the finding mode are illustrated, and can be applied to, for example, an automatic gain control unit of a receiving end, to control a gain of a received signal and thus to increase the gain converging speed. In FIG. 4A, steps S410 and S420 represent the following condition mentioned below. While the gain is adjusted by way of automatic gain control, at least one characteristic value (i.e., at least one local maximum and at least one local minimum of the gain) obtained from the relationship between the gain and time is detected. Step S410 is to find the local maximum or minimum when the gain is being adjusted. If one of them is found, it is judged whether the at least one local maximum and the at least one local minimum are found in the step S420. If not, the step S410 is continually performed until at least one local maximum and at least one local minimum are found. In step S430, a switching value is determined according to the detected characteristic value (i.e., the at least one local maximum and the at least one local minimum), and the gain is set according to the switching value. For example, the gain is set to the switching value or other values obtained based on the switching value. As shown in step S435, each time when the gain is set, it is necessary to wait for a period of time to ensure that the value of the switching point becomes valid. As shown in step S440, the steps S410 to S430 may be performed one time or multiple times. If the switching value needs not to be calculated to set the gain, the finding mode may ends after the gain is set at the last time. The embodiment may be adapted to the stationary receiving environment, and the gain control result of FIG. 3D may be obtained.

Figure 4B:
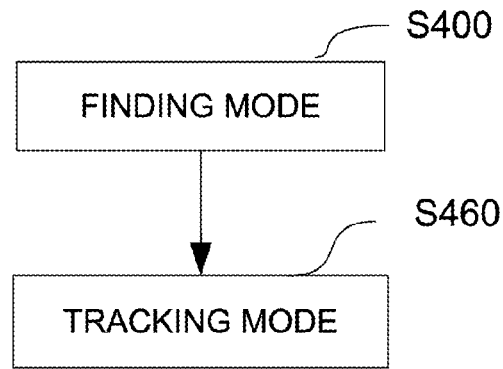
FIG. 4B is a flow chart showing the automatic gain control method applied to a dynamic receiving environment according to another exemplary embodiment.

FIG. 4B is a flow chart showing the automatic gain control method according to another exemplary embodiment. In this embodiment, block S400 represents the finding mode shown in the flow chart of FIG. 4A. A tracking mode is entered after the finding mode ends. This embodiment is adapted to the dynamic receiving environment, and the gain control result shown in FIG. 3A or 3B may be obtained. Block S460 determines to adjust the gain or keep the gain unchanged in the tracking mode periodically according to the comparison result between the estimated strength value of the received signal and a predetermined signal strength. A period at which the gain is adjusted in the tracking mode is greater than a period of the system clock of the communication system. In detail, the period at which the gain is adjusted in the tracking mode is greater than the period at which the gain is adjusted before the gain enters the tracking mode. For example, in the orthogonal frequency division multiplexing (OFDM) communication system, the period at which the gain is adjusted in the tracking mode is greater than the time length of a code.

Figure 4C:
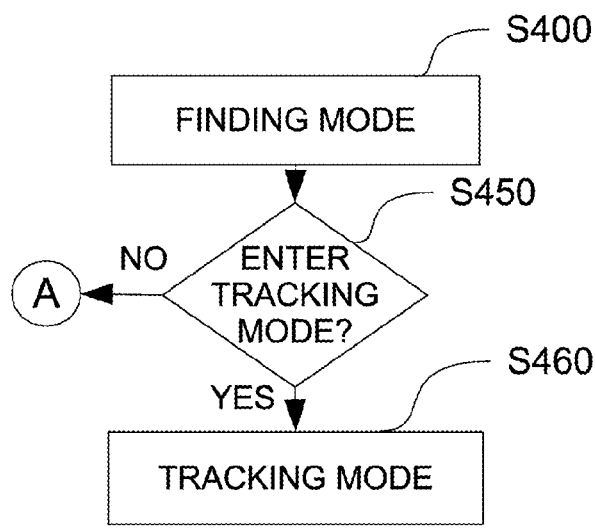
FIG. 4C is a flow chart showing the automatic gain control method selectively applied to a stationary or dynamic receiving environment according to still another exemplary embodiment.

FIG. 4C is a flow chart showing the automatic gain control method selectively applied to the stationary receiving or dynamic receiving environment according to still another exemplary embodiment. As shown in FIG. 4C, what is different from FIG. 4B will be described in the following.

After the finding mode, step 450 judges whether the tracking mode has to be entered. If yes, the tracking mode represented by the block S460 is entered. If not, other control may be performed or the procedures may end. Here, the step 450 functions to achieve the optimization, and to adapt the embodiment of this method to different receiving environments. The communication system performing the method of this embodiment may judge whether the tracking mode has to be entered, or whether the parameters therein have to be set in the step S450 according to the requirement or the actual condition. The judging criteria may be, for example, whether the currently received signal is obtained from the dynamic environment; whether the dynamic environment has the high speed (e.g., a moving high speed train a moving vehicle on the super highway); or whether the signal strength of the received signal reaches a threshold value. Thus, the optimum effect of automatic gain control may be achieved in response to different conditions according to this embodiment.

Next, different implementation of the steps in the finding mode and the tracking mode according to the embodiment will be described in the following.

In FIG. 4A, the steps S410 and S420 represent the following condition. When the gain is adjusted by way of automatic gain control, at least one characteristic value, obtained from the relationship between the gain and time, is detected. The characteristic value may be, for example, at least one local maximum and at least one local minimum of the gain curve. In addition, the characteristic value may further be another value representing the gain variation characteristic, such as the gain corresponding to the inflection point on the gain curve or the zero second order differential of the gain variation with respect to time. Several examples of the definitions of the characteristic values will be illustrated in the following.

Figure 5A:
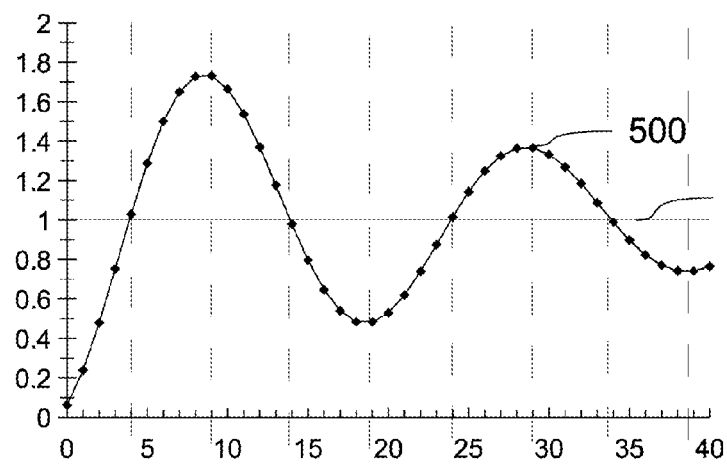
FIGS. 5A and 5B are schematic illustrations showing a determining method, with local maximum and minimum values serving as characteristic values, in a finding mode of the automatic gain control method according to some exemplary embodiments.

First, the local maximum and the local minimum serve as the characteristic values of the gain variation. FIG. 5A shows the relationship between the gain and time in the finding mode of the automatic gain control method of the exemplary embodiment, wherein the horizontal axis represents the time, and the vertical axis represents the value of the gain. FIG. 5A shows multiple gains obtained in a time interval, and the gains may be substantially regarded as the gains obtained after the gain curve 500 is sampled. The straight line 501 represents the gain level of the target, wherein the gain corresponding to the time point n is referred to as y[n].

In a first example, multiple gains with the relationship between the gain and time are compared in a time interval to determine the local maximum and the local minimum. For example, the gains have the following relationship: $y[7]<y[8]<y[9]>y[10]>y[11]$ at the time between the time points 7 and 11 of FIG. 5A, and the gain $y[9]$ may be regarded as a local maximum. In addition, the gains have the following relationship: $y[17]>y[18]>y[19]<y[20]<y[21]$ at the time between the time points 17 and 21, and the gain $y[19]$ may be regarded as a local minimum. The sampling frequency of the gain curve may be greater than or equal to the sampling frequency of the digital converter.

Figure 5B:
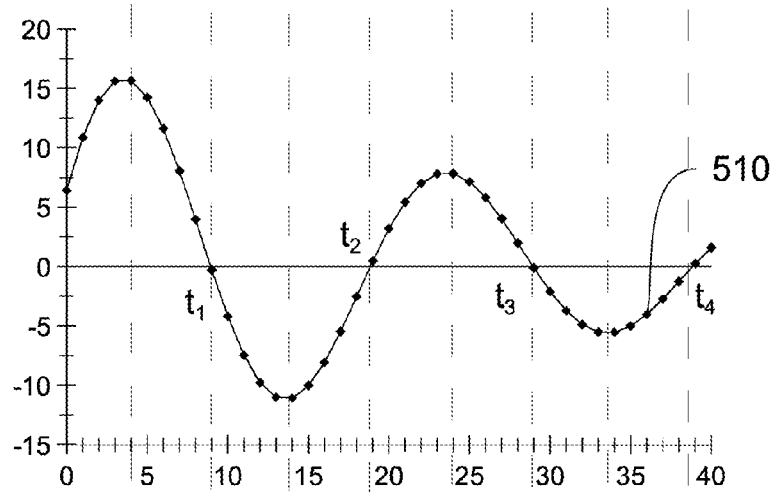

The second example is to find the gain corresponding to the time point when the first order differential of the gain variation is substantially equal to zero in a time interval. The gains may be substantially regarded as the stationary points of the gain curve 500. Next, the gain obtained in the previous step is determined as the local maximum or minimum according to the relationship between the gain values corresponding to these stationary points. For example, the curve 510 of FIG. 5B represents the first order differential of the gain curve 500 of FIG. 5A, and at least one set of time points (e.g., the time points $t_1, t_2, t_3, t_4$ in FIG. 5B) when the first order differential of the gain is equal to zero is found. According to $t_1, t_2, t_3, t_4$, the gains corresponding to the gain curve are respectively $y[t_1], y[t_2], y[t_3], y[t_4]$, and the gains are compared with one another to obtain the relationship. Because $y[t_1]>y[t_2], y[t_2]<y[t_3], y[t_3]>y[t_4]$, it is possible to judge $y[t_1]$ and $y[t_3]$ (respectively equal to about $y[9], y[29]$) as the local maximums, and the $y[t_2]$ and $y[t_4]$ (respectively equal to about $y[19], y[39]$) as the local minimums.

The third example may further adopt the method of the second example except that the second order differential of the gain curve 500 is further determined, and it is judged whether the gains corresponding to these time points are the local minimums or maximums using the time points $t_1, t_2, t_3, t_4$ when the first order differential is equal to zero and according to whether the value corresponding the second order differential is positive or negative. Because this is the basic application of the principle of Calculus, detailed descriptions thereof will be omitted.

Figure 6:
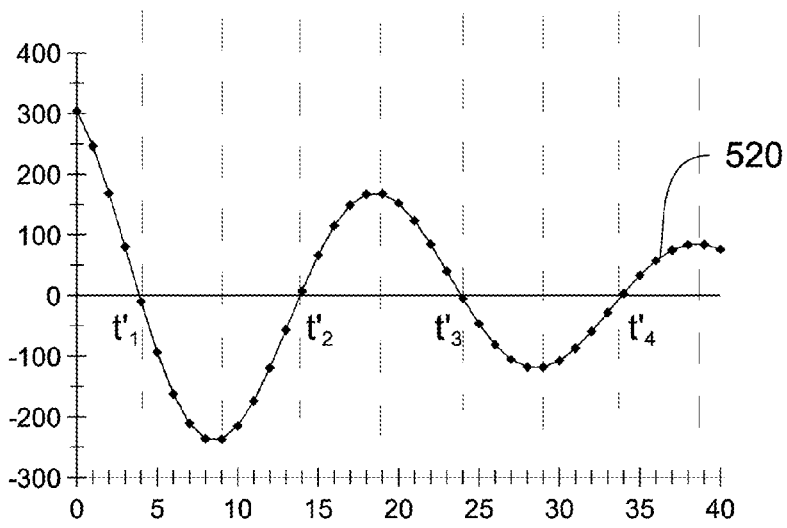
FIG. 6 is a schematic illustration showing a determining method, with an inflection point serving as the characteristic value of the gain variation, in the finding mode of the automatic gain control method according to one exemplary embodiment.

In addition to the local maximum and minimum serving as the characteristic values of gain variation, the characteristic value of the gain variation may be defined as the gain corresponding to the time point when the second order differential of the gain variation is equal to zero substantially. According to the point of view of the gain curve, this characteristic value corresponds to the inflection point of the gain curve 500. As shown in FIG. 6, the curve 520 shows the variation relationship between the second order differentials of the gain curve 500 in FIG. 5A. The time point, at least one point (e.g., the time points $t'_1, t'_2, t'_3, t'_4$ in FIG. 6) when the second order differential of the gain is equal to 0 substantially is found. According to $t'_1, t'_2, t'_3, t'_4$, the gains corresponding to the gain curve 500 are respectively labeled as $y[t'_1], y[t'_2], y[t'_3], y[t'_4]$. These gains may be substantially regarded as the target gain level. So, only at least one of the gains (e.g., $y[t'_1]$) is obtained, and the gain may be set to the new gain in the step S430.

In the step S430, the switching value is obtained according to at least one characteristic value. Different implementation may be obtained according to the definition of the characteristic value. The object thereof is to find a switching value and thus to determine how to set the varying gain such that the gain may be switched to a new gain, which is close to the target gain level. For example, the characteristic values are defined by at least one local maximum and at least one local minimum, but the weighted sum of these local maximums and minimums may be derived as a switching value, such as the average. In addition, if the characteristic value is defined as the gain corresponding to the zero second order differential of the relationship between the gain and time (may be regarded as the inflection point of the gain curve), then the gain may be directly set to the switching value. Furthermore, it is also possible to determine the switching value according to other algorithms. For example, the average of the gains corresponding to the inflection points may serve as the switching value so that the gain may be set to enhance the precision. In addition, the switching point may also be determined by locally maximizing and minimizing the element properties of the automatic gain control unit at the receiving end. The element properties are directed to, for example, the relationships between an input signal power of a variable gain amplification unit, an output signal power of the variable gain amplification unit and the gain, and the relationship between an input signal and the gain of the variable gain amplification unit.

To sum up, the step of detecting at least one or more characteristic values in the finding mode is to estimate the current type of the gain variation so that the gain may be set in the step S430. Therefore, any characteristic value capable of substantially reflecting the type of the gain variation may be adopted to implement the steps S410 and S420. For example, the gain control signal of the variable gain amplification unit relates to the variation of the gain. Thus, the step of detecting at least one characteristic value of the gain control signal may be regarded as the embodiment equivalent to the steps S410 and S420.

When the methods of the above-mentioned embodiments are implemented, if the tracking mode is entered after the steps including the steps S410 to S430 are performed only once in the finding mode, then step S440 may be omitted. In addition, in other implementation, as shown in FIG. 3B, the variation of the gain curve may be repeatedly detected and the switching value position is calculated at least once such that the gain switching point value gradually approaches the ideal level. In addition, each time when the gain is set to the value of the switching point, a period of time has to be waited to ensure that the value of the switching point become valid, as shown in the step S435. In addition, this waiting time may be properly set according to the element property of the automatic gain control unit at the receiving end. For example, in the TUA 6034 tuner of Infineon Technologies, the waiting time may be set to 110 ms.

Figure 4D:
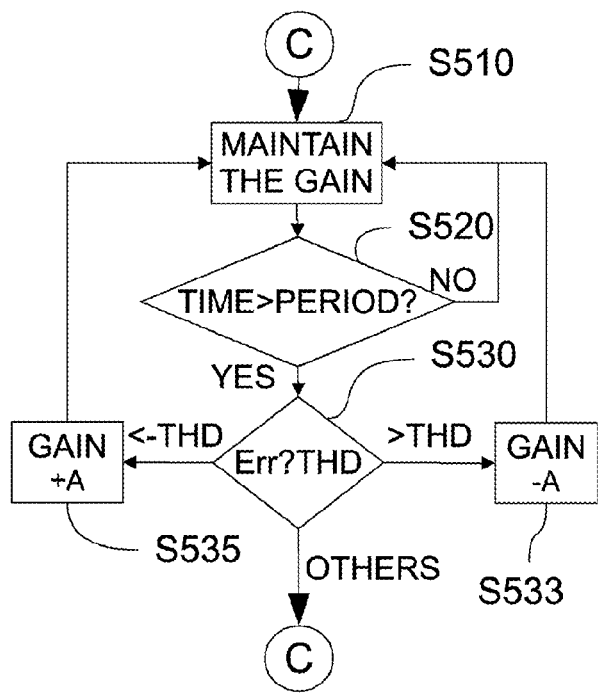
FIG. 4D is a flow chart showing a tracking mode of the automatic gain control method according to one exemplary embodiment.
Figure 7A:
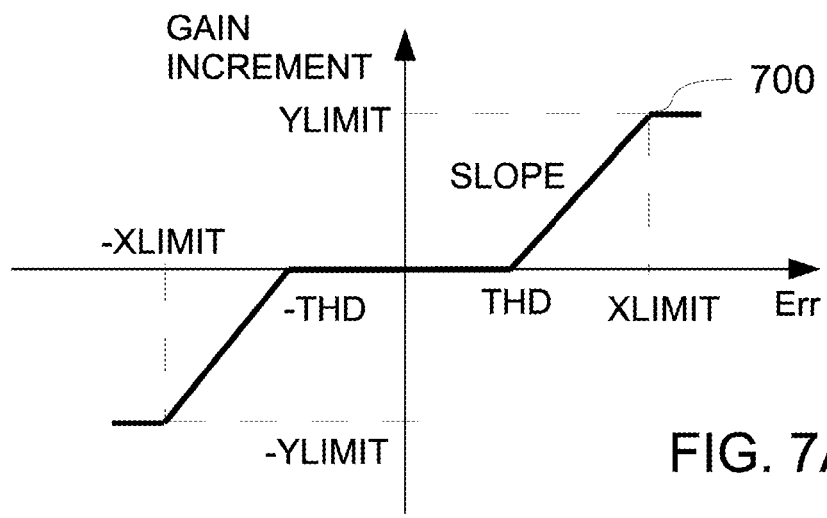
FIG. 7A is a schematic illustration showing the definition of characteristic curve parameters of a gain incremental function.

In step S460 shown in FIGS. 4B and 4C, after the tracking mode is entered, the comparison result between the estimated value of the received signal strength and the predetermined signal strength is periodically checked to determine the adjusting direction as increasing the amplitude A, decreasing the amplitude A or being kept unchanged. For example, "A" is a gain incremental function, or a function A(·) of the output result of the signal strength comparator. If the gain incremental function is shown in FIG. 7A, then an embodiment of the step S460 is shown in the flow chart of FIG. 4D. In steps S510 and S520, the gain is kept for a period. If the keeping time reaches a period, as shown in step S530, a relationship between a comparison result Err and a threshold value THD is checked. If the absolute value of the comparison result Err is not greater than the threshold value THD, then the gain is kept unchanged, that is, the gain increment is 0, so the method goes back to the step S510. If the absolute value of the comparison result Err is greater than the threshold value THD and the estimated strength value of the received signal is greater than the predetermined signal strength, then the gain is decreased, as shown in step S533, that is, the gain increment is a negative value −A. If the absolute value of the comparison result Err is greater than the threshold value THD and the estimated strength value of the received signal is less than the predetermined signal strength, then the gain is increased, as shown in step S535, that is, the gain increment is a positive value +A. The variation of the gain increment +A or −A may be determined according to the gain incremental function A(·). As shown in FIG. 7A, for example, when the comparison result Err ranges between the threshold value THD and another threshold value XLIMIT, the gain increment A is equal to SLOPE*(Err−THD), wherein SLOPE represents the slope of the line segment. When the comparison result Err is greater than XLIMIT, then the gain increment A is equal to the value YLIMIT.

Figure 7B:
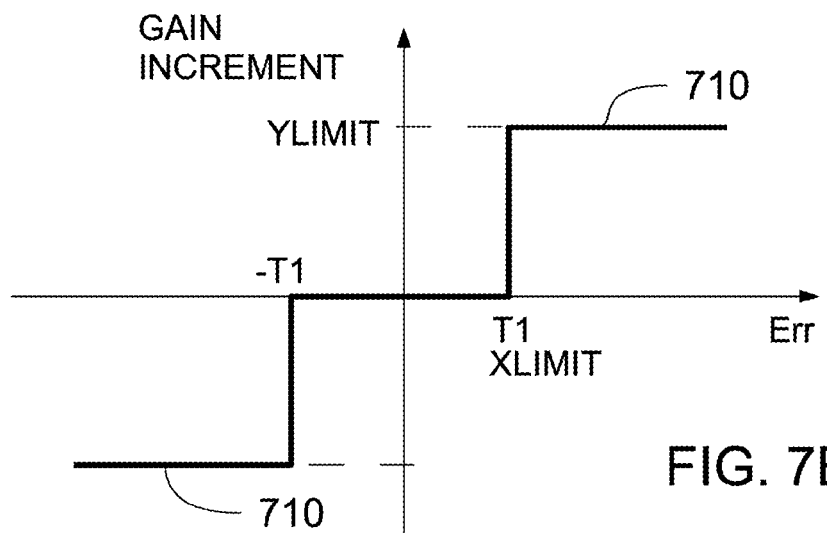
FIGS. 7B and 7C show examples of the definitions of the characteristic curve parameters of the gain incremental function.
Figure 7C:
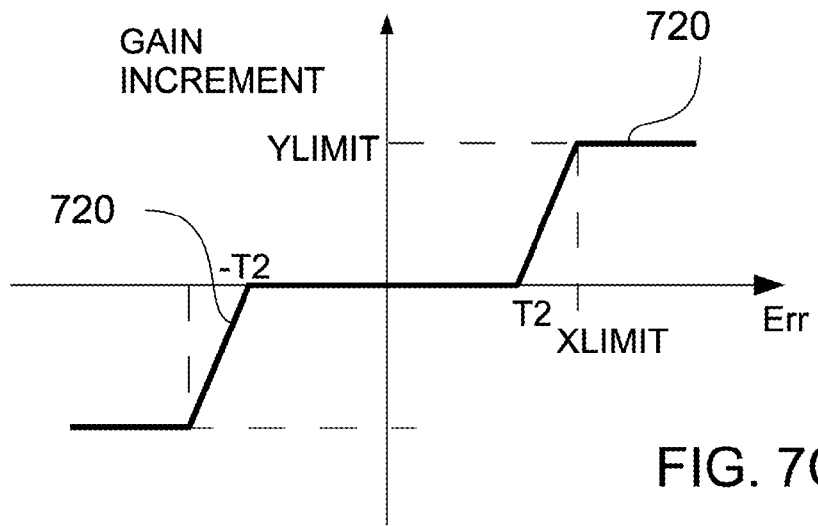

Thus, the characteristic curve of the gain incremental function may be defined according to the parameters THD, SLOPE, XLIMIT and YLIMIT. FIGS. 7B and 7C show two other examples of the gain incremental functions, wherein the gain incremental transfer curves 710 and 720 respectively have different threshold values T1 and T2. When the comparison result is greater than the threshold value, the gain increments +A have different variations. With regard to the gain incremental transfer curve 710, when the comparison result is greater than T1, the gain increment +A is the fixed value YLIMIT. With regard to the gain incremental transfer curve 720, when the comparison result is greater than T2, the gain increment +A changes with the change of the comparison result. Therefore, in the step S460, the influence of the noise on the system may be reduced with the high speed movement so that the suitable update period and the suitable gain incremental function may be selected, and the jitter noise may be reduced while the compensation track path loss ability may be kept.

Several embodiments of the automatic gain control apparatus will be disclosed in the following, wherein these embodiments can perform the automatic gain control methods mentioned hereinabove.

Figure 8A:
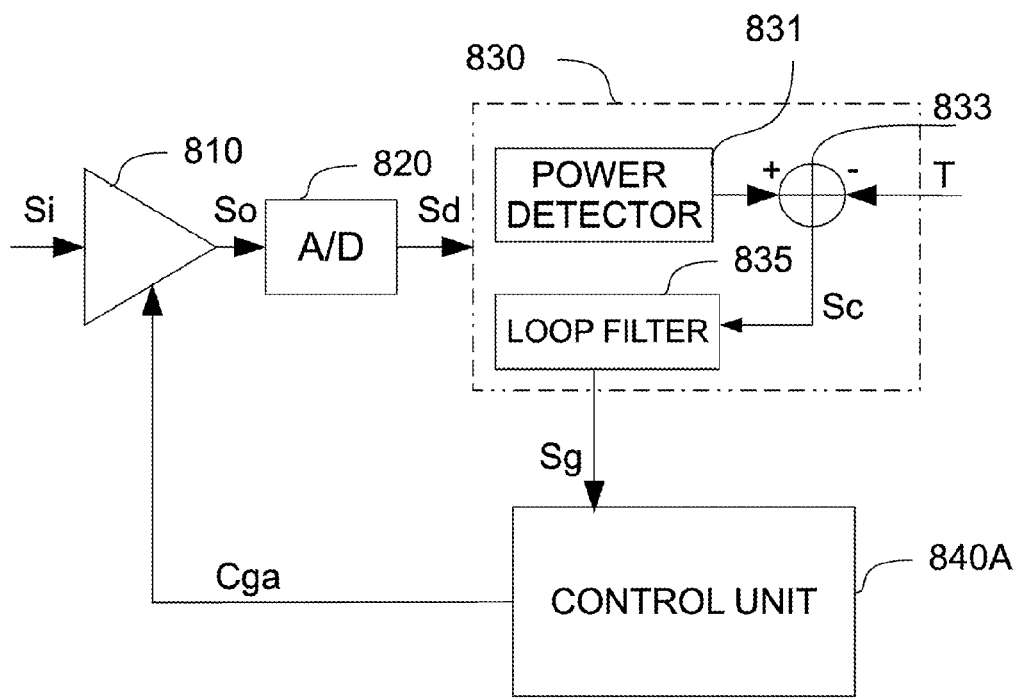
FIG. 8A is a block diagram showing an automatic gain control apparatus according to an exemplary embodiment.

FIG. 8A is a block diagram showing an automatic gain control apparatus 800 according to an exemplary embodiment. As shown in FIG. 8A, the automatic gain control apparatus is applied to a communication system to control a gain of a received signal such that the gained signal satisfies the signal strength requirement of the communication system. The automatic gain control apparatus 800 includes a variable gain amplification unit 810, an analog-to-digital converter 820, a detection unit 830 and a control unit 840A. The variable gain amplification unit 810 amplifies a received signal Si into a first signal So according to a gain represented by an analog gain control signal Cga. The analog-to-digital converter 820 generates a digital signal Sd according to the first signal So. The detection unit 830 generates a gain signal Sg and a comparison signal Sc according to the digital signal Sd and a target level signal T. The control unit 840A generates the above-mentioned analog gain control signal Cga according to the gain signal Sg, wherein the variable gain amplification unit 810 amplifies the received signal Si by the gain adjusted according to the analog gain control signal Cga.

When the control unit 840A operates in a finding mode, after the control unit 840A detects at least one characteristic value, obtained from the relationship between the value of the gain signal Sg and time, a switching value is determined according to the at least one characteristic value, and the analog gain control signal Cga is set to represent that the gain is switched to a new gain. This gain may be the switching value or the value calculated according to the switching value.

The embodiment of the automatic gain control apparatus may perform the embodiment of the automatic gain control method, and is particularly adapted to the stationary receiving environment. The variable gain amplification unit 810 includes, for example, a variable gain amplifier or a programmable gain amplifier. The control unit 840A is, for example, a programmable circuit, such as a microprocessor, a microcontroller, a digital signal processor, a field programmable logic gate array, or any other logic circuit. In the finding mode, the control unit 840A may be, for example, programmed to implement the method shown in FIG. 4A, or may be implemented by the hardware circuit. In addition, in the finding mode, the control unit 840A determines the analog gain control signal Cga according to the gain signal Sg at the beginning. While the gain is being adjusted, the control unit 840A detects at least one characteristic value of the value variation of the gain signal Sg. After the at least one characteristic value is detected, the control unit 840A additionally determines the switching value according to the at least one characteristic value to determine the analog gain control signal Cga.

During the implementation, the control unit 840A may also be configured to set two or more than two switching values. When the control unit 840A is setting the previous switching value, the analog gain control signal Cga is not changed until the value of the switching point becomes valid, and then the control unit 840A determines the analog gain control signal Cga according to the gain signal Sg, as shown in the condition of the gain variation between the time points 311 and 312 of FIG. 3D. After the control unit 840A again detects at least one characteristic value of the value variation of the gain signal Sg, such as the local maximum and the local minimum, the control unit 840A determines the analog gain control signal Cga according to the switching value determined at this time, as shown at the time point 312 of FIG. 3D. Thus, the gain can further approach a target gain level represented by the target level signal T. For example, the condition of selecting the next switching point is that the difference represented by the comparison signal is less than that represented by the comparison signal corresponding to the previous switching point. In addition, the switching value is also calculated according to the at least one characteristic value, the weighted sum thereof, or the average thereof. Furthermore, the element property of the variable gain amplification unit 810, such as the relationship between the input/output signal power and the gain, and the relationship between the input signal and the gain, can reflect the trend and speed of the gain convergence. Thus, the relationships between the above-mentioned elements may be considered in the design phase to determine the proper weighting coefficients or ratios for calculation.

Figure 9A:
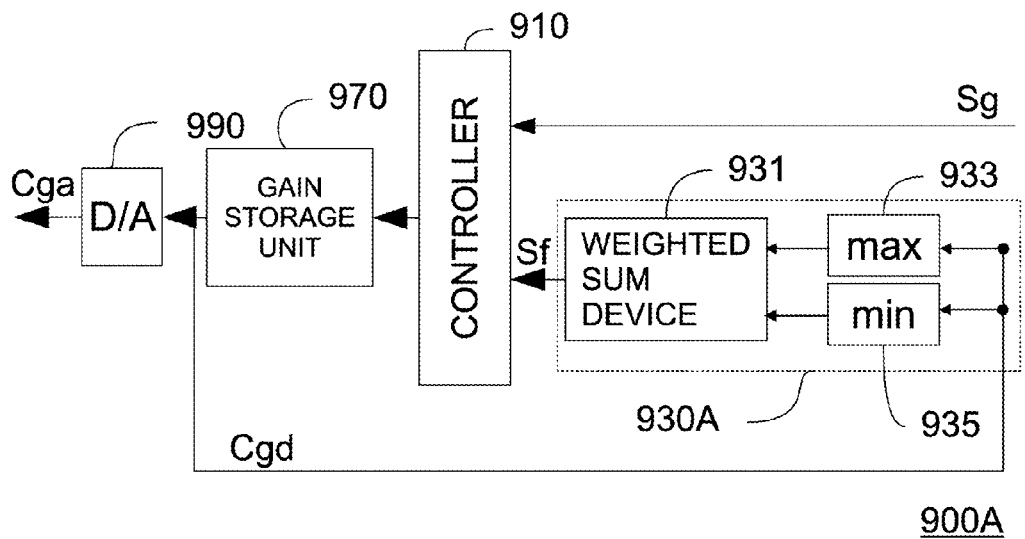
FIG. 9A is a block diagram showing a first embodiment of a control unit in the automatic gain control apparatus of FIG. 8A.
Figure 9B:
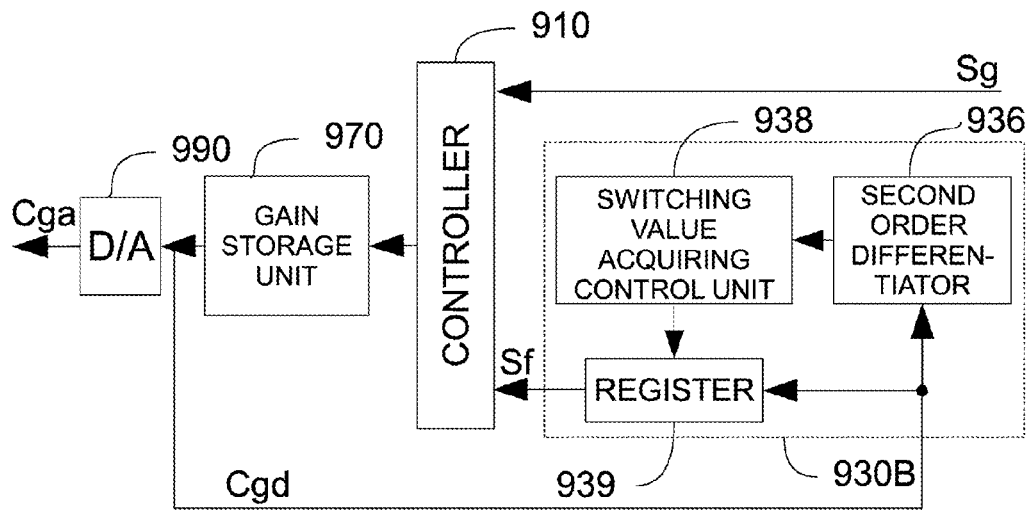
FIG. 9B is a block diagram showing a second embodiment of the control unit in the automatic gain control apparatus of FIG. 8A.

As shown in FIGS. 9A and 9B, the control units 900A and 900B represent implement the circuit block diagram of the embodiment of the control unit 840A of FIG. 8A. In FIG. 9A, the control unit 900A receives the gain signal Sg and thus generates the analog gain control signal Cga. The control unit 900A includes a controller 910, a switching value determining unit 930A, a gain storage unit 970 and a digital-to-analog converter 990.

The digital-to-analog converter 990 receives a digital gain control signal Cgd, and converts it into the analog gain control signal Cga.

The switching value determining unit 930A receives the digital gain control signal Cgd outputted from the gain storage unit 970, and thus detects the local maximum and the local minimum of the gain variation, and obtains the switching value after calculation to generate a gain switching signal Sf.

The controller 910 receives the gain signal Sg and the gain switching signal Sf. Similar to the operation of the automatic gain control apparatus of the above-mentioned embodiment in the finding mode, the controller 910 adopts one of the signals Sg and Sf as the source of generating the digital gain control signal Cgd, and thus controls the variable gain amplification unit 810. In the finding mode, when the controller 910 is adjusting the gain according to the gain signal Sg, it sets the digital gain control signal Cgd according to the gain switching signal Sf to switch the gain to the new gain.

In FIG. 9A, the switching value determining unit 930A detects at least one local maximum and at least one local minimum as the characteristic values. The switching value determining unit 930A includes a maximum detecting unit 933, a minimum detecting unit 935 and a weighted sum device 931 for generating the gain switching signal Sf. This example may implement the condition shown in FIG. 5A, wherein the local maximum and minimum are determined according to the compared relationship between a plurality of gains or equal values in a time interval. For example, the digital gain control signal Cgd may be substantially regarded as the variation of the gain. The maximum detecting unit 933 and the minimum detecting unit 935 receive multiple gains represented by the digital gain control signal Cgd in a time interval, and their relationships are compared to determine the local maximums and minimums, which are respectively stored. After at least one local maximum and at least one local minimum are obtained, they are outputted to the weighted sum device 931 so that the switching values may be calculated and the gain switching signal Sf may be generated. The controller 910 receives the notification of the gain switching signal Sf to make the source of generating the digital gain control signal Cgd switch from the gain signal Sg to the gain switching signal Sf so that the gain of the variable gain amplification unit 810 may be controlled. Under the stationary receiving environment, the controller 910 may wait for the new gain, which comes valid, and make the source of generating the digital gain control signal Cgd recover to the gain signal Sg so that the gain control result of FIG. 3D may be obtained.

In addition, the switching value determining unit 930A may further implement the condition shown in the example of FIG. 5B, wherein the local maximum and the local minimum are determined according to the gain variation relationship, its first order differential or even its second order differential. During implementation, the switching value determining unit 930A may further be provided with a first order differentiator or a second order differentiator.

In addition, FIG. 9B shows another embodiment of the control unit 840, which is different from the control unit 900A of FIG. 9A in that the switching value determining unit 930B of the control unit 900B of FIG. 9B detects the second order differential of the relationship between the at least one gain and time as the characteristic value. Thus, the characteristic value and switching point determining method shown in FIG. 6 may be implemented. For example, the switching value determining unit 930B includes a second order differentiator 936, a switching value acquiring control unit 938 and a register 939. The second order differentiator 936 receives the digital gain control signal Cgd and performs the second order differential signal processing on the value of the gain variation. The switching value acquiring control unit 938 detects the time point when the second order differential is equal to zero and outputs a signal, controls the register 939 to store the corresponding gain value, and further generates the gain switching signal Sf to notify the controller 910. Thus, the controller 910 switches the source of generating the digital gain control signal Cgd from the gain signal Sg to the gain switching signal Sf. This is similar to the operation of the controller 910, and detailed descriptions thereof will be omitted.

Figure 8B:
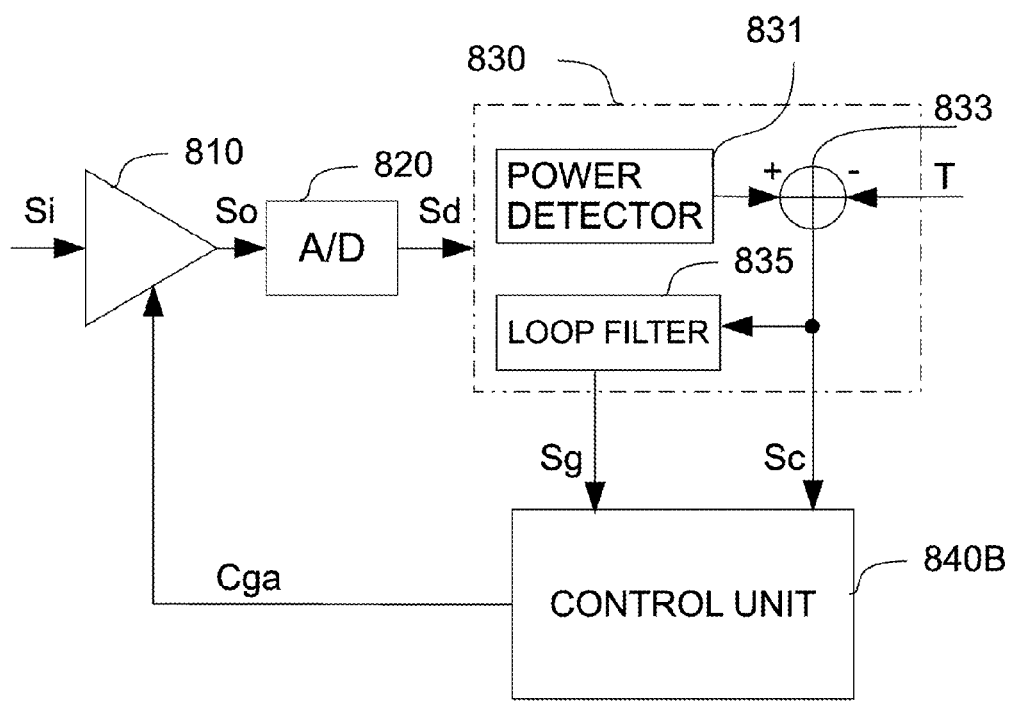
FIG. 8B is a block diagram showing an automatic gain control apparatus according to another exemplary embodiment.

FIG. 8B shows another embodiment of the automatic gain control apparatus. This embodiment differs from that of FIG. 8A in that the control unit 840B of the automatic gain control apparatus of FIG. 8B generates the analog gain control signal Cga according to the gain signal Sg and the comparison signal Sc. The control unit 840B of this embodiment can implement the finding mode, and further have the tracking mode and is thus adapted to the dynamic receiving environment. Thus, this embodiment can implement the embodiment of the automatic gain control method shown in FIG. 4B or 4C.

In the tracking mode, the control unit 840B periodically determines whether to adjust the analog gain control signal Cga according to the comparison signal Sc to represent that the gain has to be increased, decreased or kept unchanged. The gain is adjusted in the tracking mode at a period greater than the period at which the gain is adjusted in the finding mode.

In the tracking mode, the control unit 840B may, for example, adjust the analog gain control signal Cga according to the relationship between the gain increment and the comparison result in FIG. 7A, 7B or 7C. In other embodiments, the control unit 840B may implement the relationship between the comparison signal Sc and the analog gain control signal Cga as a function relationship, which is implemented in the control unit 840B by way of programming or the hardware circuit. In addition, in the different implementation of the control unit 840B, a memory (not shown) may further be added to assist the control unit 840 in storing the read signal and the processed data, or the value of the gain control signal Cga. In other embodiment, the memory may also be built in the control unit 840B.

Figure 9C:
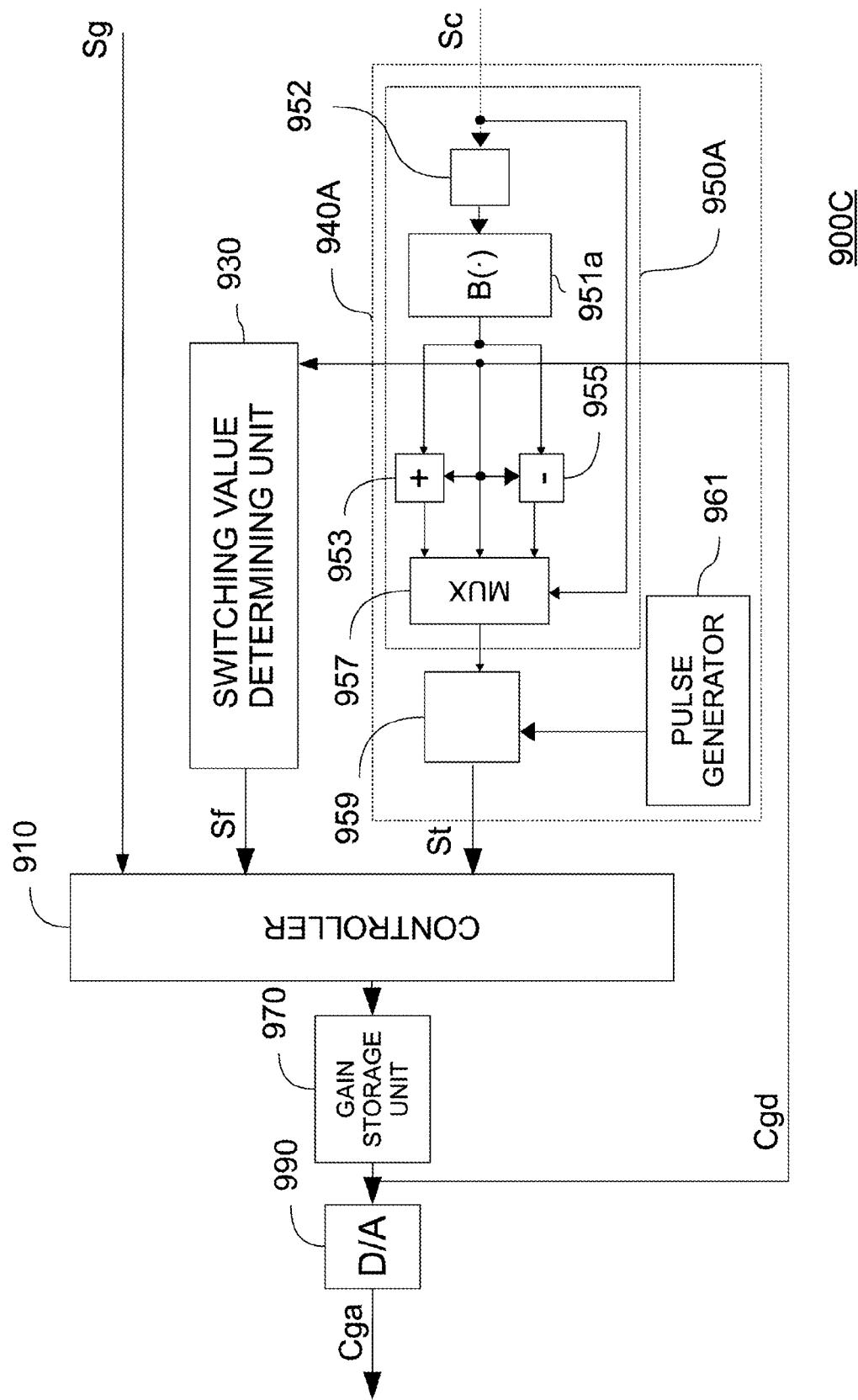
FIG. 9C is a block diagram showing a third embodiment of the control unit in the automatic gain control apparatus of FIG. 8B.

In addition, the control unit 840B may also be implemented by other circuit elements. FIG. 9C shows an embodiment of the control unit 840B. In FIG. 9C, the control unit 900C receives the gain signal Sg and the comparison signal Sc, and thus generates the analog gain control signal Cga. The control unit 900C includes a controller 910, a switching value determining unit 930, a gain tracking unit 940A, a gain storage unit 970 and a digital-to-analog converter 990. Compared with the control unit of FIG. 9A or 9B, the control unit 900C further includes a gain tracking unit 940A for implementing the tracking mode, in which the controller 910 receives a gain tracking signal St of the gain tracking unit 940A.

The switching value determining unit 930, such as a switching value determining unit 930A or 930B, implements the finding mode.

The gain tracking unit 940A receives the digital gain control signal Cgd and the comparison signal Sc, and thus generates the gain tracking signal St.

The controller 910 receives the gain signal Sg, the gain switching signal Sf and the gain tracking signal St. Similar to the operations of the finding mode and the tracking mode of the automatic gain control apparatus of the above-mentioned embodiments, the controller 910 adopts one of the signals Sg, Sf and St as the source of generating the digital gain control signal Cgd, and thus controls the variable gain amplification unit 810. In the finding mode, the controller 910 sets the digital gain control signal Cgd according to the gain switching signal Sf. In the tracking mode, the controller 910 adjusts the digital gain control signal Cgd according to the gain tracking signal St. In one example, the controller 910 includes a multiplexer and has determination circuitry for controlling the multiplexer to select one of the signals Sg, Sf and St. During the implementation, the controller 910 may perform the switching operations twice or more in the finding mode. In the example adopting the two switching points, the determination circuitry in the controller 910 selects the signals Sg, Sf, Sg, Sf and St in order. In addition, the controller 910 may also be implemented by the microprocessor, the microcontroller or any other logic circuit.

Referring again to FIG. 9C, an embodiment of the gain tracking unit 940A includes a tracking value generator 950A, a latch 959 and a periodic pulse generator 961. The gain tracking unit 940A periodically generates the gain tracking signal St according to the comparison signal Sc. Thus, in the tracking mode, the output of the circuit for generating a gain incremental function is provided to a storage, such as the latch 959, and the pulse generator 961 periodically generates clocks for controlling the output of the latch. The periodic gain tracking signal St makes the period at which the gain is adjusted in the tracking mode be greater than the period at which the gain is adjusted in the finding mode.

In FIG. 9C, the tracking value generator 950A includes a function generating circuit 951a, an operation unit 952 for generating an absolute value, an adder 953, a subtracter 955 and a multiplexer 957. The operation unit 952 obtains an absolute value Sca of the comparison result represented by the comparison signal Sc. The function generating circuit 951a implements the output of a gain incremental function B(·) according to the absolute value Sca of the comparison result serving as the input. For example, the gain incremental function B(·) may be regarded as the function corresponding to the first quadrant of the gain incremental function A(·) in FIG. 7A, 7B or 7C. The gain incremental function B(·) corresponds to the input of the positive value and has the output with the positive value. The multiplexer 957 has three channels of inputs and one channel of control or judgment input, such as Sc. When Sc is greater than a threshold value THD and Sc is positive, the multiplexer 957 selects the output of the third channel of the subtracter 955, that is, the result obtained by subtracting the output of the gain incremental function 951a from the previous digital gain control signal Cgd outputted from the gain storage unit 970. When Sc is greater than the threshold value THD and Sc is negative, the multiplexer 957 selects the output of the first channel of the adder 953, that is, the result obtained by adding the output of the gain incremental function 951a to the previous digital gain control signal Cgd outputted from the gain storage unit 970. In other conditions, the multiplexer 957 selects the output of the second channel of the gain storage unit 970.

Figure 9D:
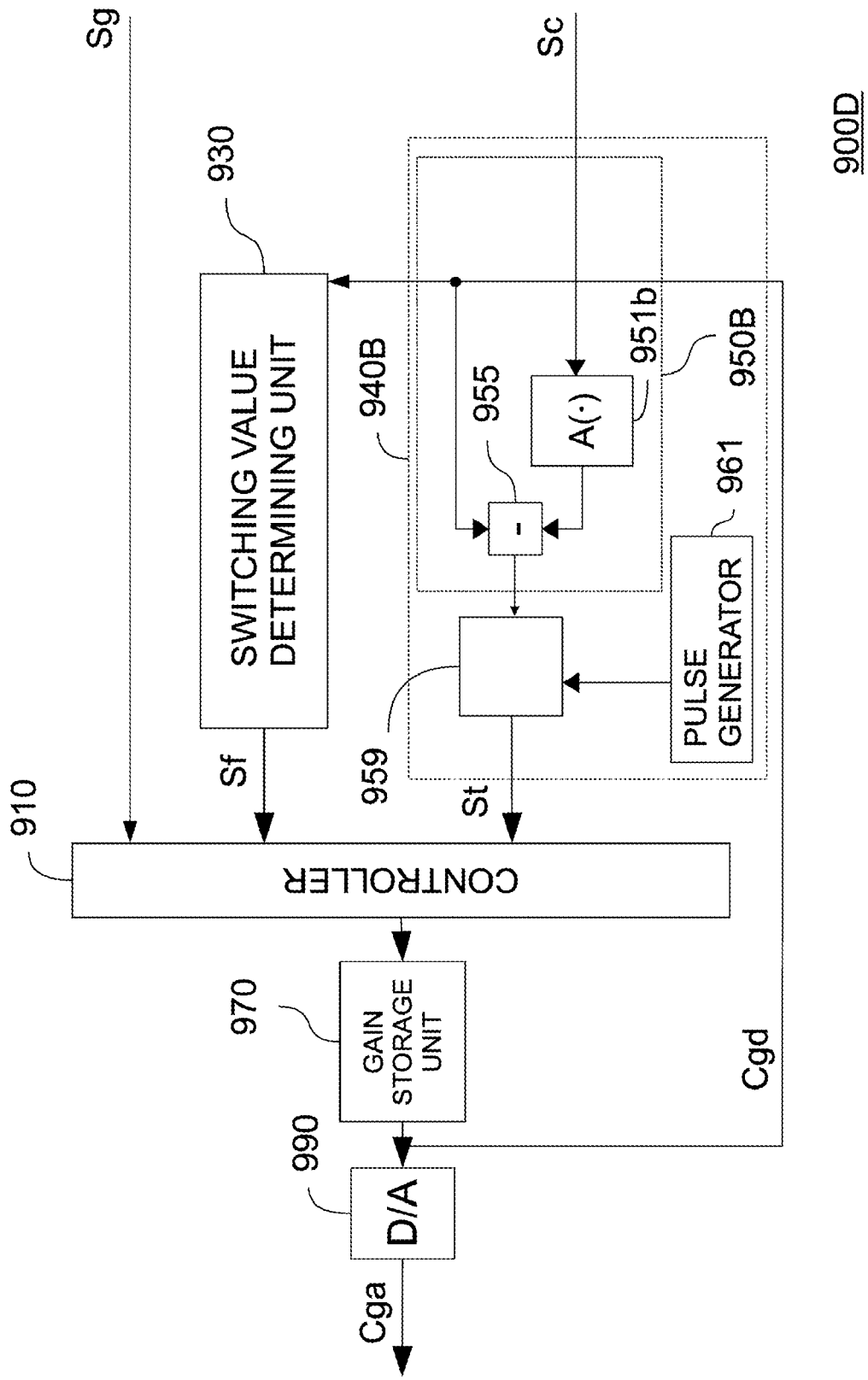
FIG. 9D is a block diagram showing a fourth embodiment of the control unit in the automatic gain control apparatus of FIG. 8B.

In addition, another example of the tracking value generator 950A is depicted in the embodiment of FIG. 9D, which is different from the embodiment of FIG. 9C in that the tracking value generator 950A is modified into a tracking value generator 950B. The tracking value generator 950B includes a function generating circuit 951b and a subtracter 955. The function generating circuit 951b implements the output of a gain incremental function A(·), such as the gain incremental function A(·) shown in FIG. 7A, 7B or 7C, according to the comparison result of the comparison signal Sc serving as the input. The subtracter 955 outputs the result obtained by subtracting the output of the gain incremental function 951b to the previous digital gain control signal Cgd. According to the level of the comparison result of the comparison signal, the function generating circuit 951b outputs the positive result of A(·), the negative result of A(·) or zero according to, for example, the gain incremental function A(·) shown in FIG.

7A, 7B or 7C. The function generating circuit 951*a* or 951*b* may be implemented by hardware using a look-up-table or a combination circuit.

Another implementation of the detection unit 830 is shown in FIG. 8A or 8B. The detection unit 830 includes a power detector 831, a comparator 833 and a loop filter 835. The power detector 831 determiners the average power of the digital signal Sd according to the digital signal Sd. The comparator 833 compares the average power of the digital signal Sd with the target level signal and thus generates the comparison signal Sc. The loop filter 835 generates the gain signal Sg according to the comparison signal Sc. In addition, in other embodiments, the detection unit 830 may be implemented by various integrated or combined aspects obtained according to different power detectors, peak value detectors, comparators and loop filters.

Figure 8C:
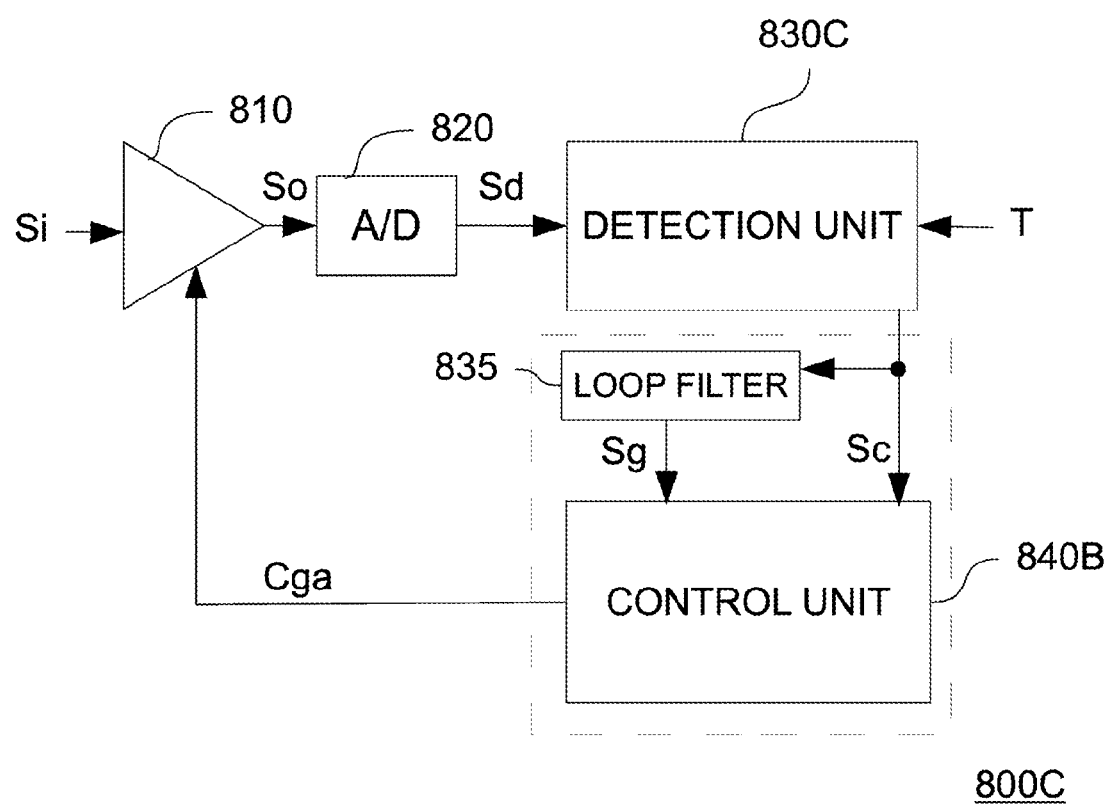
FIG. 8C is a block diagram showing an automatic gain control apparatus according to still another exemplary embodiment.

Further, FIG. 8C illustrates an automatic gain control apparatus 800C according to another exemplary embodiment. The automatic gain control apparatus shown in FIG. 8C differs from that illustrated in FIG. 8B in the detection unit, denoted by 830C, and the arrangement of the loop filter 835. In FIG. 8C, the loop filter 835 is separated from the detection unit 830C, which can be regarded as a power discriminator. Similarly, another embodiment can be derived from FIG. 8A by rearranging the loop filter 835 as shown in FIG. 8C. In addition, the loop filter and control unit, such as those in FIG. 8C or similar embodiments, can be regarded as one control unit to determine a switching value, as illustrated in the above examples. Such control unit can be implemented as an integrated circuit or other manner, for example, with a processing module such as digital signal processor and programmable logic arrays to perform the function of the loop filter and control unit as illustrated in the above examples. Moreover, the detection unit 830C and such control unit, i.e., loop filter 835 and control unit 840B, can be regarded as a main control unit so as to be implemented in an integrated or other layout manner. Likewise, the detection unit 830 in FIG. 8A or 8B and its control unit can also be regarded as a main control unit so as to be implemented in an integrated or other layout manner.

Figure 10:
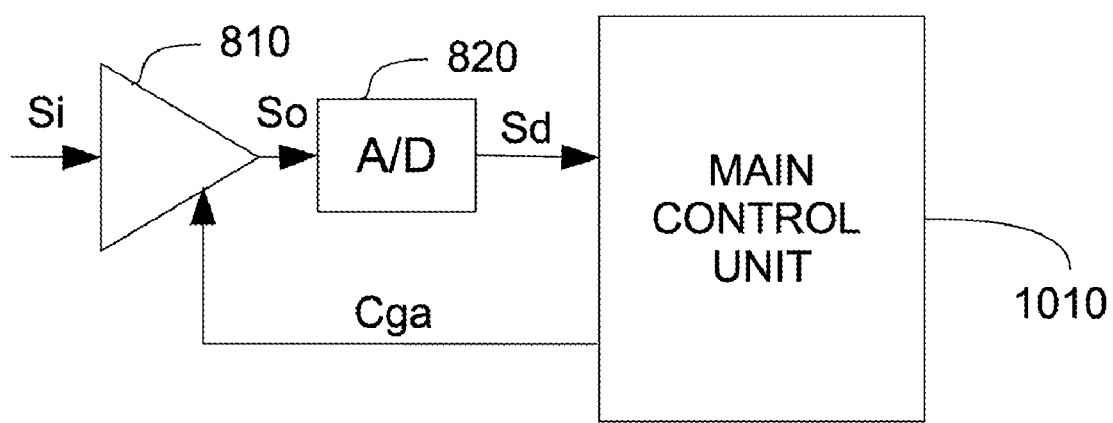
FIG. 10 is a block diagram showing an automatic gain control apparatus according to another exemplary embodiment.

In addition, in other embodiments, the detection unit 830 of FIG. 8A or 8B may be combined with the control unit thereof to form a main control unit, such as the main control unit 1010 of FIG. 10, which may be implemented by a programmable processing circuit, a digital signal processor or a logic circuit. In addition, the analog-to-digital converter 820 and the main control unit 1010 may be implemented using a microcontroller or a digital signal processor with a built-in analog-to-digital converter.

Figure 11A:
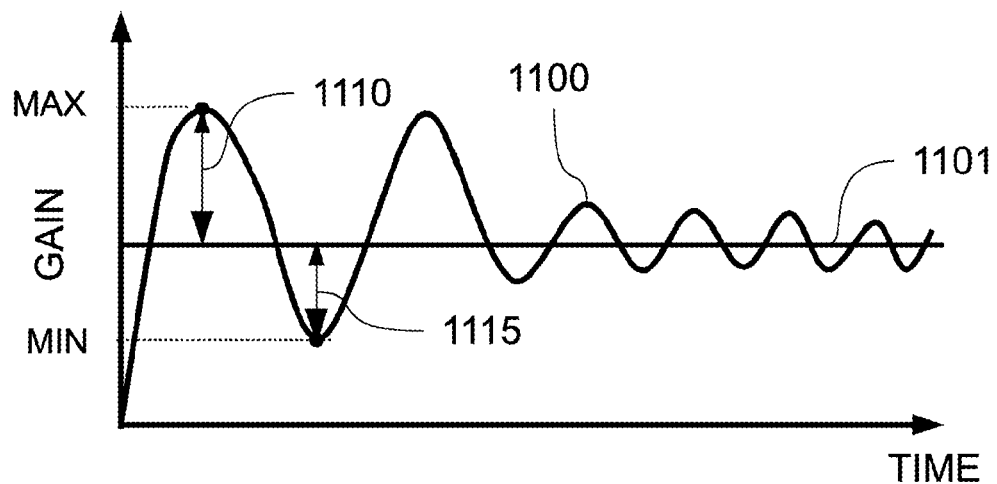
FIGS. 11A and 11B are gain curves for illustrating examples of calculating switching points of the finding mode by way of measurement.

Furthermore, the suitable ratio measuring method and the switching point calculating method in the finding mode of the above-mentioned embodiment will be described in the following according to the gain curve of FIG. 11A and the automatic gain control apparatus 1000 serving as an example. According to the automatic gain control apparatus 1000, it is possible to obtain the calculated suitable ratio of the switching value by measuring the relationship between the gain and time, or measuring the gain curve variation. First, the main control unit 1010 is utilized to observe the level of the long-time gain converge, which is set to the ideal gain level, such as the ideal gain level 1101 of the gain curve 1100 shown in FIG. 11A. Next, differences $D_{max}$ and $D_{min}$ between the ideal gain level and a maximum MAX and a minimum MIN of the gain curve are respectively calculated, as shown by the values represented by the arrows 1110 and 1115 of FIG. 11A or the values represented by the arrows 1130 and 1135 of FIG. 11B. The suitable ratio R is set to $R=D_{min}/(D_{max}+D_{min})$.

Figure 11B:
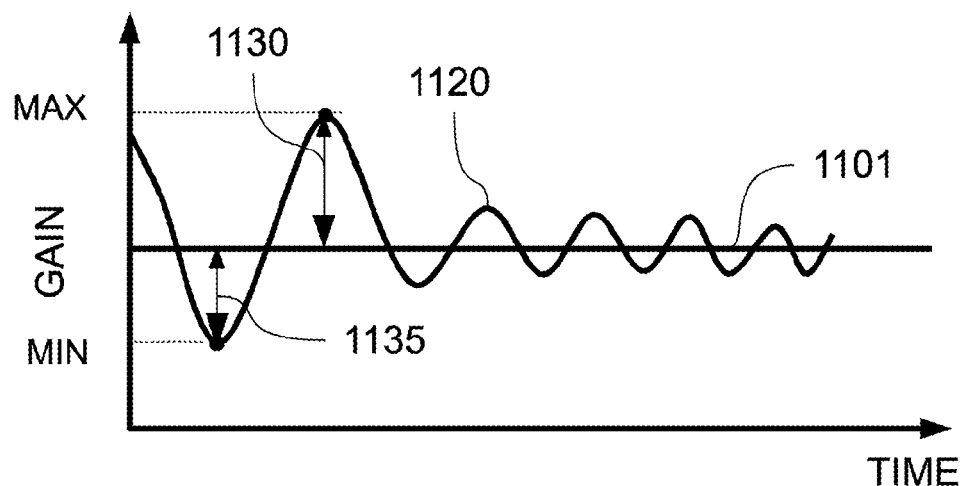

Thus, the control unit 840 calculates the switching value according to the suitable ratio R, wherein examples will be described with reference to FIGS. 11A and 11B. If the maximum appears before the minimum, as shown in FIG. 11A, then the switching value may be set to MAX·R+MIN·(1−R). If the minimum appears before the maximum, as shown in FIG. 11B, then the switching value may be set to MIN·R+MAX·(1−R).

Figure 12:
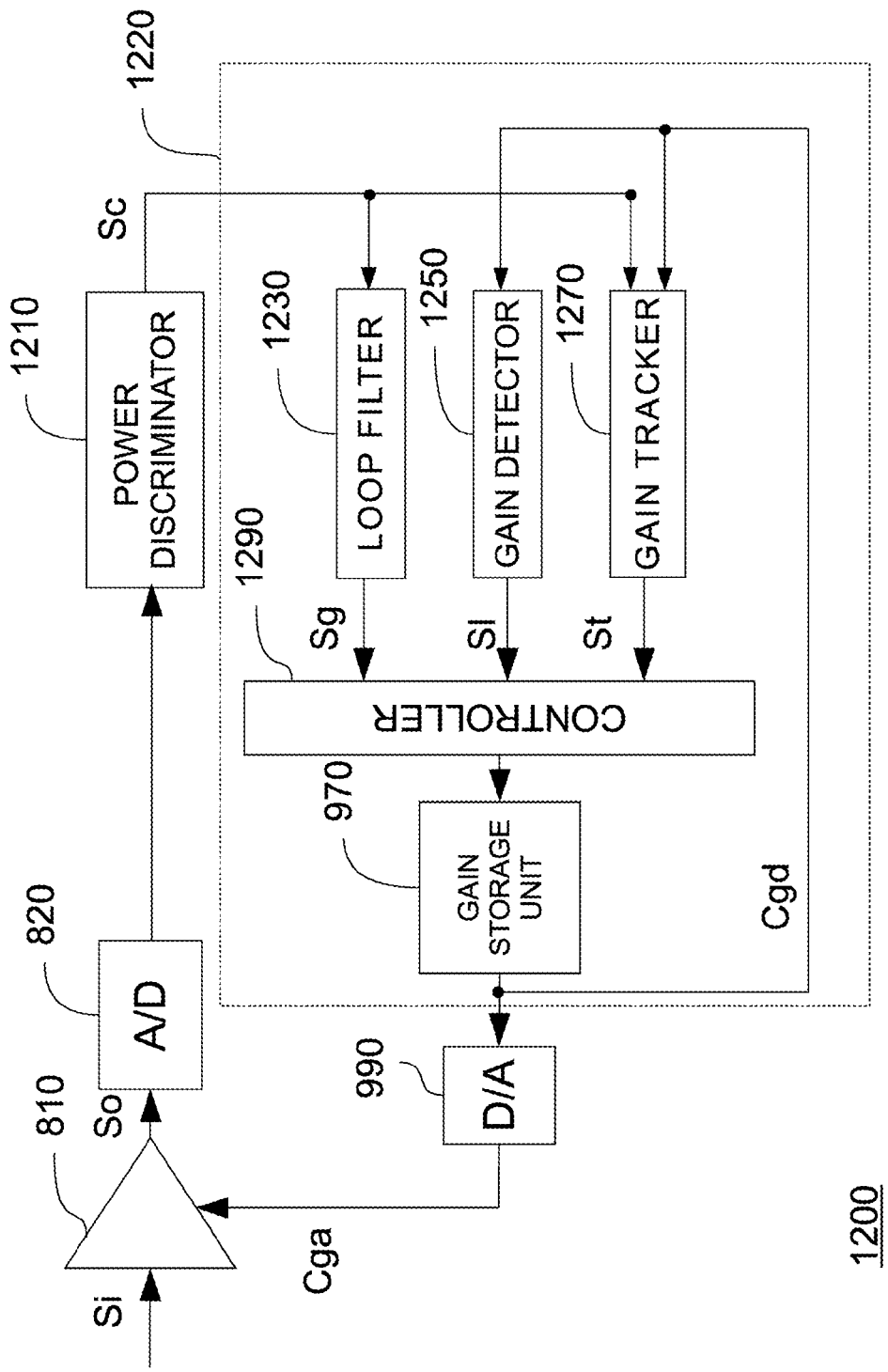
FIG. 12 is a block diagram showing an automatic gain control apparatus according to another exemplary embodiment.

FIG. 12 is a block diagram showing an automatic gain control apparatus 1200 according to another exemplary embodiment. As shown in FIG. 12, the automatic gain control apparatus 1200 may also implement the embodiment of the automatic gain control method. The embodiment of FIG. 12 differs from that of FIG. 8B in that a power discriminator 1210 is adopted to achieve the functions of the power detector 831 and the comparator 833 shown in FIG. 8B, and thus to generate the comparison signal Sc. In another example, the power discriminator 1210 includes a power detector 831 and a comparator 833. In addition, the automatic gain control apparatus 1200 further includes a control unit 1220. The control unit 1220 is different from the control unit 900 and includes a loop filter 1230, a gain detector 1250, a gain tracker 1270 and a controller 1290. The loop filter 1230 may be, for example, the loop filter 835 of FIG. 8B. The power discriminator 1210 receives a signal sampled by the analog-to-digital converter and thus generates the comparison signal Sc. The comparison signal Sc is inputted to the loop filter 1230 and the gain tracker 1270. The gain curve is generated by the controller 1290 based on the gain signal Sg outputted from the loop filter 1230, the output signal Sl of the gain detector and the gain tracking signal St generated by the gain tracker. The gain detector 1250 is, for example, the switching value determining unit 930. In another example, the gain detector 1250 may be implemented to find and record the characteristic values, such as the local maximum and minimum, while the switching point is determined by the controller 1290 with the calculation function. The gain tracker 1270 is, for example, the gain tracking unit 940A or 940B. The controller 1290 is, for example, a programmable processor or any other logic circuit, which receives the gain signal Sg, the output signal Sl and the gain tracking signal St and has the operations similar to those in the finding mode and the tracking mode of the automatic gain control apparatus according to the above-mentioned embodiment. The controller 1290 takes one of the signals Sg, Sl and St as the source of generating a digital gain control signal Cgd (or the analog gain control signal Cga), and thus controls the variable gain amplification unit 810.

In addition, based on the automatic gain control apparatus 1200 of FIG. 12, it is unnecessary to implement the gain tracker 1270 in an embodiment adapted to the stationary receiving environment, and the gain detector 1250 may be implemented by, for example, the switching value determining unit 930.

With regard to the controller (e.g., 910 or 1290) shown in the embodiments of FIGS. 9A to 9D and 12, the gain storage unit 970 may be integrated into the controller in other examples. In addition, in order to implement the embodiment of the automatic gain control method of FIG. 4C in other examples, the controller may additionally receive the signal coming from another communication system to obtain the condition or parameter of the receiving environment, and to selectively determine whether the tracking mode has to be further entered according to the receiving environment and the actual condition (e.g., the dynamic environment is the high speed or low speed environment).

In addition, based on the embodiment shown in FIGS. 9A, 9B, 9C, 9D or 12, the digital-to-analog converter 990 may be independent from the control unit or contained in the control unit in other examples.

In addition, based on the embodiment shown in FIG. 8A, 8B, 10 or 12, the variable gain amplification unit 810 is modified to another variable gain amplification unit or programmable gain amplification unit capable of receiving the digital signal (e.g., the digital gain control signal Cgd) to control the gain in other examples. So, it is unnecessary to use the digital-to-analog converter 990 to generate the analog gain control signal Cga. The variable or programmable gain amplification unit controls the gain through, for example, a digital interface, such as a sequence peripheral interface (SPI) or an inter-integrated circuit (I2C) protocol.

The automatic gain control methods and apparatuses have been disclosed in the above-mentioned exemplary embodiments. The finding mode determines at least one switching value to shorten the gain converging time during the gain converging process. In addition, other embodiments further implement the tracking mode in the dynamic receiving environment to enhance the path loss compensation while reducing the influence of the noise on the system. Thus, the gain converging speeds in various receiving environments may be improved, and the signal receiving performance may be enhanced.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. An automatic gain control method, comprising:
   (a) adjusting a gain of a received signal in a finding mode, while additionally changing the gain at least once according to a variation condition of a gain curve of the gain such that the gain approaches a target gain level, wherein the step of additionally changing the gain comprises the sub-steps of:
      detecting at least one characteristic point of the gain curve, wherein the at least one characteristic point of the gain curve comprises at least one point of the gain curve, at which a first order or a second order differential of the gain curve with respect to time is equal to zero substantially;
      determining a switching value for making the gain approach the target gain level according to a gain of the gain curve corresponding to the at least one point; and
      setting the gain to a new gain according to the switching value and making the new gain become valid;
   wherein the detecting, determining and setting sub-steps are performed at least once.

2. The method according to claim 1, wherein in the detecting sub-step of the step (a), the at least one characteristic point of the gain curve comprises at least one local maximum and at least one local minimum of the gain curve, and the switching value is determined according to the at least one local maximum and the at least one local minimum.

3. The method according to claim 2, wherein in the detecting sub-step of the step (a), the at least one local maximum and the at least one local minimum of the gain curve are determined according to at least two neighboring stationary points obtained from the gain curve in a time interval.

4. The method according to claim 1, wherein in the detecting sub-step of the step (a), the at least one characteristic point of the gain curve comprises at least one inflection point of the gain curve; the inflection point of the gain curve corresponds to one point of the gain curve, at which a second order differential of the gain curve with respect to time is equal to zero substantially; and the switching value is determined according to the gain of the gain curve corresponding to the at least one inflection point.

5. The method according to claim 1, further comprising the step of:
   (b) entering a tracking mode after the step of setting the gain is performed for the last time, wherein in the tracking mode, whether the gain is to be adjusted is determined periodically, and the gain is adjusted in the tracking mode at a period greater than a period at which the adjusting of the gain is in the finding mode.

6. The method according to claim 5, wherein in the step (b), it is periodically determined whether to adjust the gain or keep the gain unchanged according to a comparison result between an estimated strength value of the received signal and a predetermined signal strength.

7. An automatic gain control apparatus, comprising:
   a variable gain amplification unit for controlling a received signal according to a gain and thus generating a first signal;
   an analog-to-digital converter for generating a digital signal according to the first signal; and
   a main control unit for generating a gain control signal according to the digital signal and a target level, wherein the gain of the variable gain amplification unit is adjusted according to the gain control signal,
   wherein when the main control unit operates in a finding mode, while the gain is being adjusted, the main control unit additionally changes the gain at least once according to at least one characteristic value, obtained from a relationship between the gain and time, such that the gain approaches a target gain level;
   wherein the at least one characteristic value comprises at least one gain corresponding to at least one point of a gain curve formed by the relationship between the gain and time, at which a first order or a second order differential of the gain curve with respect to time is equal to zero substantially, and the main control unit additionally changes the gain at least once according to the at least one gain corresponding to the at least one point of the gain curve.

8. The apparatus according to claim 7, wherein the main control unit comprises:
   a detection unit for generating a gain signal according to the digital signal and a target level signal; and
   a control unit for generating a gain control signal according to the gain signal, wherein the gain of the variable gain amplification unit is adjusted according to the gain control signal,
   wherein when the control unit operates in a finding mode, while the adjusting of the gain is being performed, the control unit additionally changes the gain at least once according to at least one characteristic value obtained from a relationship between the gain and time such that the gain approaches a target gain level.

9. The apparatus according to claim 8, wherein the control unit detects at least one characteristic value obtained from a relationship between a value of the gain control signal and time as the at least one characteristic value obtained from the relationship between the gain and time so as to determine a switching value, and sets the gain control signal according to the switching value to additionally set the gain such that the gain approaches the target gain level.

10. The apparatus according to claim 8, wherein:
after the gain additionally set for the last time becomes valid, the control unit enters a tracking mode, in which the control unit periodically determines whether to adjust the gain or not, wherein a period, during which the gain is adjusted in the tracking mode at a period greater than a period at which the gain is adjusted in the finding mode.

11. The apparatus according to claim 10, wherein after the gain additionally set at the last time becomes valid, the tracking mode is entered when the automatic gain control apparatus is applied in a dynamic receiving environment.

12. The apparatus according to claim 10, wherein the control unit periodically determines whether to adjust the gain or keep the gain unchanged according to a comparison result between an estimated strength value of the received signal and a predetermined signal strength.

13. The apparatus according to claim 8, wherein the control unit comprises:
a switching value determining unit for detecting the at least one characteristic value, obtained from the relationship between the gain signal and time, according to the gain control signal to obtain a switching value so as to generate a gain switching signal; and
a controller for receiving the gain signal and the gain switching signal and thus generating the gain control signal, wherein in the finding mode, the controller sets the gain control signal to set the gain according to the gain switching signal.

14. The apparatus according to claim 13, wherein in the finding mode, the at least one characteristic value comprises: at least one local maximum and at least one local minimum, obtained from the relationship between the gain signal and time, wherein the switching value is determined according to the at least one local maximum and the at least one local minimum.

15. The apparatus according to claim 8, further comprising:
a gain tracking unit for periodically determining whether to adjust the gain control signal to generate a gain tracking signal in a tracking mode according to the gain control signal and a comparison signal;
wherein the detection unit further generates the comparison signal according to the digital signal and the target level signal; and in the tracking mode, a controller further adjusts the gain control signal to set the gain according to the gain tracking signal.

16. The apparatus according to claim 7, wherein the main control unit detects at least one characteristic value obtained from a relationship between a value of the gain control signal and time as the at least one characteristic value obtained from the relationship between the gain and time to determine a switching value, and sets the gain control signal according to the switching value to additionally set the gain such that the gain approaches the target gain level.

17. The apparatus according to claim 16, wherein in the finding mode, the at least one characteristic value comprises: at least one local maximum and at least one local minimum obtained from the relationship between the gain and time, wherein the switching value is determined according to the at least one local maximum and the at least one local minimum.

18. The apparatus according to claim 17, wherein the at least one local maximum and the at least one local minimum are determined according to at least two gains, which are obtained from the relationship between the gain and time in a time interval and are adjacent with respect to time, and can make a first order differential of a gain curve corresponding to the gain with respect to time be substantially equal to zero.

19. The apparatus according to claim 17, wherein the switching value is determined according to the at least one local maximum, the at least one local minimum, a relationship between an input/output signal power and the gain of the variable gain amplification unit, and a relationship between the input signal and the gain of the variable gain amplification unit.

20. The apparatus according to claim 16, wherein the at least one characteristic value comprises: at least one gain, which makes a second order differential of a gain curve corresponding to the relationship between the gain and time be equal to zero substantially, wherein the switching value is determined according to the at least one gain.

21. The apparatus according to claim 7, wherein:
after the gain additionally set at the last time becomes valid, the main control unit enters a tracking mode, in which the main control unit periodically determines whether to adjust the gain or not, wherein the gain is adjusted in the tracking mode at a period greater than a period at which the gain is adjusted in the finding mode.

22. The apparatus according to claim 21, wherein the main control unit periodically determines whether to adjust the gain or keep the gain unchanged according to a comparison result between an estimated strength value of the received signal and a predetermined threshold.

23. The apparatus according to claim 7, wherein the main control unit comprises:
a power discriminator for generating a comparison signal according to the digital signal and a target level signal; and
a control unit for generating a gain control signal according to the comparison signal, wherein the gain of the variable gain amplification unit is adjusted according to the gain control signal,
wherein when the control unit operates in a finding mode, while the gain is being adjusted, the control unit additionally changes the gain at least once according to at least one characteristic value obtained from a relationship between the gain and time such that the gain approaches a target gain level.

24. The apparatus according to claim 23, wherein the control unit detects at least one characteristic value obtained from a relationship between a value of the gain control signal and time as the at least one characteristic value obtained from the relationship between the gain and time to determine a switching value, and sets the gain control signal according to the switching value to additionally set the gain such that the gain approaches the target gain level.

25. The apparatus according to claim 23, wherein:
after the gain additionally set at the last time becomes valid, a tracking mode is entered, wherein in the tracking mode, the control unit periodically determines whether to adjust the gain, wherein the gain is adjusted in the tracking mode at a period greater than a period at which the gain is adjusted in the finding mode.

26. The apparatus according to claim 25, wherein the control unit periodically determines whether to adjust the gain or keep the gain unchanged according to a comparison result between an estimated strength value of the received signal and a predetermined threshold.

27. The apparatus according to claim 23, wherein the control unit comprises a loop filter for generating a gain signal according to the comparison signal to obtain a gain curve of the gain.

28. The apparatus according to claim 27, wherein the control unit further comprising:
- a gain detection unit for detecting a local maximum and a local minimum of a gain curve of the gain signal to obtain an output signal according to the gain control signal;
- a gain tracking unit for periodically determining whether to adjust the gain control signal to generate a gain tracking signal according to the gain control signal and the comparison signal in a tracking mode; and
- a controller for receiving the gain signal, the output signal and the gain tracking signal and thus generating the gain control signal; wherein in the finding mode, the controller sets the gain control signal to set the gain according to the output signal; and in the tracking mode, the controller adjusts the gain control signal according to the gain tracking signal.

* * * * *